United States Patent
Dutta et al.

(10) Patent No.: US 10,243,089 B2
(45) Date of Patent: Mar. 26, 2019

(54) PHOTOVOLTAIC DEVICE FOR GENERATING ELECTRICAL POWER USING NONLINEAR MULTI-PHOTON ABSORPTION OF INCOHERENT RADIATION

(71) Applicant: Raytheon Company, Waltham, MA (US)

(72) Inventors: Partha Sarathi Dutta, Clifton Park, NY (US); Mitchell B. Haeri, Irvine, CA (US); Gerard L. Rafanelli, Fountain Valley, CA (US)

(73) Assignees: Raytheon Company, Waltham, MA (US); Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 14/567,200

(22) Filed: Dec. 11, 2014

(65) Prior Publication Data

US 2015/0372168 A1 Dec. 24, 2015

Related U.S. Application Data

(60) Provisional application No. 62/014,489, filed on Jun. 19, 2014.

(51) Int. Cl.
| | | |
|---|---|---|
| G02F 1/35 | (2006.01) |
| H01L 31/042 | (2014.01) |
| H01L 31/054 | (2014.01) |
| H01L 31/0304 | (2006.01) |
| H01L 31/0693 | (2012.01) |
| H01L 31/0224 | (2006.01) |

(52) U.S. Cl.
CPC .... *H01L 31/022433* (2013.01); *G02F 1/3526* (2013.01); *H01L 31/03046* (2013.01); *H01L 31/042* (2013.01); *H01L 31/0543* (2014.12); *H01L 31/0693* (2013.01); *Y02E 10/52* (2013.01); *Y02E 10/544* (2013.01)

(58) Field of Classification Search
CPC ............... H01L 31/022433; H01L 31/0543
See application file for complete search history.

(56) References Cited

U.S. PATENT DOCUMENTS

| | | |
|---|---|---|
| 2013/0134309 A1 | 5/2013 | Rapaport |
| 2014/0130845 A1 | 5/2014 | Ohki |

FOREIGN PATENT DOCUMENTS

| | | |
|---|---|---|
| JP | 2006-186340 | 7/2006 |
| JP | 2008-130801 A | 6/2008 |
| JP | 2013-046000 A | 3/2013 |
| WO | WO 2008/011152 A2 | 1/2008 |
| WO | WO 2008/011152 A3 | 1/2008 |

(Continued)

OTHER PUBLICATIONS

PCT International Search Report and Written Opinion dated Sep. 15, 2015 corresponding to International Application No. PCT/US2015/035014; 13 Pages.

(Continued)

*Primary Examiner* — Shannon M Gardner
(74) *Attorney, Agent, or Firm* — Daly, Crowley, Mofford & Durkee, LLP

(57) ABSTRACT

Methods, systems, and photovoltaic devices converting broad spectrum incoherent optical power into electrical power by utilizing nonlinear multi-photon absorption and optionally enhanced by the application of magnetic fields, electric fields, or both during the power conversion process.

13 Claims, 28 Drawing Sheets

(56) References Cited

FOREIGN PATENT DOCUMENTS

| WO | WO 2010/126162 A1 | 4/2010 |
|---|---|---|
| WO | WO 2013/001944 A1 | 1/2013 |

OTHER PUBLICATIONS

Fathpour et al., "Two-Photon Photovoltaic Effect in Silicon;" IEEE Journal of Quantum Electronics, vol. 43, No. 12; Dec. 2007; 7 Pages.

Marti et al., "IBPOWER: Intermediate Band Materials and Solar Cells for Photovoltaics with High Efficiency and Reduced Cost;" 34$^{th}$ IEEE Photovoltaic Specialists Conference (PVSC); Jun. 2009; 6 Pages.

Trupke et al., "Improving Solar Cell Efficiencies by Up-Conversion of Sub-Band-Gap Light;" Journal of Applied Physics, vol. 92, No. 7; Oct. 2002; 6 Pages.

Auston et al., "Picosecond Spectroscopy of Semiconductors;" Proceedings of Solid-State Electronics, vol. 21; 1978; 4 Pages.

Bhat et al., "Crystal Growth and Below-Bandgap Optical Absorption Studies in InAs for Non-Linear Optic Applications;" Journal of Crystal Growth, vol. 310; 2008; 7 Pages.

Blackwell, "Design, Fabrication, and Characterization of a Micro Fuel Processor;" Thesis submitted to the Department of Chemical Engineering at Massachusetts Institute of Technology; Feb. 2008; 174 Pages.

Chandola et al., "Below Bandgap Optical Absorption in Tellurium-doped GaSb;" Semiconductor Science and Technology, vol. 20; Jun. 14, 2005; 8 Pages.

Doyle et al., "Development and Demonstration of a 25 Watt Thermophotovoltaic Power Source for a Hybrid Power System;" National Aeronautics and Space Administration (NASA)—Glenn Research Center; Aug. 2001; 52 Pages.

Dutta, "Crystal-Growth Technology for Ternary III-V Semiconductor Production by Vertical Bridgman and Vertical Gradient Freezing Methods with Accelerated Crucible Rotation Technique;" Crystal Growth Technology, Chapter 12; 2008; 31 Pages.

Evans et al., "VOC Controls;" Section 3 EPA/452/B-02-001; Section 3.2 VOC Destruction Controls; Chapter 1 Flares; Sep. 2000; 46 Pages.

Fraunhofer-Institut fur Solar Solare Energiesysteme ISE, "World Record Solar Cell with 44.7% Efficiency;" Press Release; Sep. 23, 2013; 3 Pages.

Gabetta, "High Efficiency Photovoltaic Power Plants: The III-V Compound Solar Cells;" PowerPoint from a CESI Seminar; May 24, 2011; 65 Pages.

Ismail et al., "Accurate Safety Zone Determination During Gas Flaring;" Journal of Engineering and Applied Sciences, vol. 4; 2009; 8 Pages.

Jalali et al., "Silicon Photonics;" Invited Paper from Journal of Lightwave Technology, vol. 24, No. 12; Dec. 2006; 16 Pages.

Kim et al., "Influence of Native Defects on the Infrared Transmission of Undoped $Ga_{1-x}In_xSb$ Bulk Crystals;" Journal of Electronic Materials, vol. 34, No. 11; 2005; 8 Pages.

Nielson, "A Thermally Efficient Micro-Reactor for Thermophotovoltaic Power Generation;" Thesis submitted to the Department of Electrical Engineering and Computer Science at Massachusetts Institute of Technology; Sep. 2006; 150 Pages.

Schlegl et al., "TPV Modules Based on GaSb Structures;" Proceedings of the Sixth Conference on Thermophotovoltaic Generation of Electricity; Nov. 2004; 9 Pages.

Sheik-Bahae et al., "Sensitive Measurement of Optical Nonlinearities Using a Single Beam;" IEEE Journal of Quantum Electronics, vol. 26, No. 4; Apr. 1990; 10 Pages.

Smestad et al., "The Thermodynamic Limits of Light Concentrators;" Solar Energy Materials, vol. 21; 1990; 13 Pages.

Van Stryland et al., "Optical Limiting with Semiconductors;" Journal of the Optical Society of America B, vol. 5, No. 9; Sep. 1988; 9 Pages.

Sze; Physics of Semiconductor Devices, 2$^{nd}$ Edition; Reference to p. 798; 1981; 3 Pages.

Walukiewicz, "Semiconductor Materials for Intermediate Band Solar Cells;" PowerPoint from the GCEP Solar Energy Workshop; Oct. 19, 2004; 26 Pages.

Xue et al., "Microthermophotovoltaics Power System for Portable MEMS Devices;" Nanoscale Microscale Thermophysical Engineering, vol. 9; Feb. 2005; 13 Pages.

PCT International Preliminary Report dated Dec. 29, 2016 corresponding to International Application No. PCT/US2015/035014; 9 Pages.

Chinese Office Action dated Aug. 3, 2017 for Chinese Patent Application No. 201580032710.5; 14 pages.

Response to Written Opinion dated Jan. 26, 2017 for European Patent Application No. 15730630.9; Response filed Jul. 17, 2017; 6 pages.

"Electrical Properties of Indium Phosphide"; Retrieved Sep. 15, 2015 from http://www.ioffe.ru/SVA/NSM/Semicond/InP/electric.html; 6 Pages.

Auston et al.; "Picosecond Spectroscopy of Semiconductors;" Solid-State Electronics; vol. 21; Jan. 1978; 4 pages.

Basu et al.; "Microscale Radiation in Thermophotovoltaic Devices—A Review;" International Journal of Energy Research; vol. 31; May 2007; 28 pages.

Bermel et al.; "Design and Global Optimization of High-Efficiency Thermophotovoltaic Systems;" Optics Express; vol. 18; No. 103; Sep. 13, 2010; 21 pages.

Bhat et al.; "Crystal Growth and Below-Bandgap Optical Absorption Studies in InAs for Non-Linear Optic Applications;" ScienceDirect; Dec. 3, 2007; 7 pages.

Blackwell, B.S.; "Design, Fabrication, and Characterization of a Micro Fuel Processor;" Massachusetts Institute of Technology; Feb. 2008; Thesis; 174 pages.

Chandola et al. "Below Band-Gap Optical Absorption in $GaxIn1-xSb$ Alloys;" Journal of Applied Physics; vol. 98; Nov. 2005; 7 pages.

Chandola et al. "Below Band-Gap Optical Absorption in Tellurium-Doped GaSb;" Institute of Physics Publishing; vol. 20; Jun. 2005; 8 pages.

Dashiell et al. "Quaternary InGaAsSb Thermophotovoltaic Diodes;" IEEE Transactions on Electron Devices; vol. 53; No. 12; Dec. 2006; 13 pages.

DiMatteo et al.; "Enhanced Photogeneration of Carriers in a Semiconductor via Coupling Across a Nonisothermal Nanoscale Vacuum Gap;" Applied Physics Letters; vol. 79; No. 12; Sep. 17, 2001; 3 pages.

Doyle et al.; "Development and Demonstration of a 25 Watt Thermophotovoltaic Power Source for a Hybrid Power System;" National Aeronautics and Space Administration; Aug. 2001; 52 pages.

Dutta; "Crystal Growth Technology for Ternary III-V Semiconductor Production by Vertical Bridgman and Vertical Gradient Freezing Methods with Accelerated Crucible Rotation Technique;" Crystal Growth Technology; Wiley-VCH; Nov. 25, 2008; 31 pages.

Evans et al.; "VOC Controls, EPA/452/B-02-001;" Section 3.2; VOC Destruction Controls, Chapter 1; Sep. 2000; 46 pages.

Fraunhofer; Institute for Solar Energysystem; ISE Press release; Sep. 23, 2013; 3 Pages.

Gabetta; "High Efficiency Photovoltaic Power Plants: The II-V Compound Solar Cells;" CESI; Jan. 2011; 65 Pages.

Geisz et al.; "40.8% Efficient Inverted Triple-Junction Solar Cell with Two Independently Metamorphic Junctions;" Applied Physics Letters; vol. 93; Sep. 2008; 3 pages.

Gfroerer et al.; Temperature Dependence of Nonradiative Recombination in Low-Band Gap $InxGa1-xAs/InAsyP1-y$ Double Heterostructures Grown on InP Substrates; Journal of Applied Physics; vol. 94; No. 3; Aug. 1, 2003; 6 pages.

Gordon et al.; "Optical Performance at the Thermodynamic Limit with Tailored Imaging Designs;" Applied Optics; vol. 44; No. 12; Apr. 20, 2005; 5 pages.

Ismail et al.; "Accurate Safety Zone Determination During Gas Flaring;" Journal of Engineering and Applied Sciences; vol. 4; Jan. 2009; 8 pages.

(56) References Cited

OTHER PUBLICATIONS

Jalali et al.; "Silicon Photonics"; IEEE Journal of Lightwave Technology; vol. 24; No. 12; Dec. 2006; 16 Pages.
Japanese Office Action dated Dec. 19, 2017 for Japanese Application No. 2016-573963; 8 Pages.
Kim et al.; "Influence of Native Defects on the Infrared Transmission of Undoped Ga1—2InxSb Bulk Crystals;" Journal of Electronic Materials; vol. 34; No. 11; Apr. 21, 2005; 8 pages.
Nielsen; A Thermally Efficient Micro-Reactor for Thermophotovoltaic Power Generation; Massachusetts Institute of Technology; Sep. 2006; 150 pages.
Rajagopalan et al.; "A Simple Single-Step Diffusion and Emitter Etching Process for High-Efficiency Gallium-Antimonide Thermophotovoltaic Devices;" Journal of Electronic Materials; vol. 32; No. 11; Oct. 2003; 5 pages.
Response to Chinese Office Action dated Sep. 1, 2017; Response filed Dec. 18, 2017 for Chinese Application No. 201580032710.5; 4 Pages.
Roth et al.; Ultrasensitive and High-Dynamic-Range Two-Photon Absorption in a GaAs Photomultiplier Tube; Optics Letters; vol. 27; No. 23; Dec. 1, 2002; 3 pages.
Schlegl et al.; "TPV Modules Based on GaSb Structures;" Sixth Conference on Thermophotovoltaic Generation of Electricity AIP; Freiburg Germany; Nov. 2004; 9 pages.
Sheik-Bahae et al.; "Sensitive Measurement of Optical Nonlinearities Using a Single Beam;" IEEE Journal of Quantum Electronics; vol. 26; No. 4; Apr. 4, 1990; 10 pages.
Shockley et al.; "Detailed Balance Limit of Efficiency of p-n Junction Solar Cells;" Journal of Applied Physics; vol. 32; No. 3; Mar. 1961; 10 pages.
Smestad et al.; "The Thermodynamic Limits of Light Concentrators;" Solar Energy Materials; 21; Jan. 1990; 10 pages.
Stryland et al.; "Optical Limiting with Semiconductors;" J. Opt. Soc. Am.; vol. 5; No. 9; Sep. 1988; 9 pages.
Sze; "Physics of Semiconductor Devices; $2^{nd}$ Edition;" John Wiley & Sons, Inc.; Jan. 1981; 3 pages.
Walukiewicz; "Semiconductor Materials for Intermediate Band Solar Cells;" GCEP Solar Energy Workshop; Stanford, CA; Oct. 19, 2004; 26 pages.
Winston et al.; "Novel Aplanatic Designs;" Optics Letters; vol. 34; No. 19; Oct. 1, 2009; 2 pages.
Response to Japanese Office Action (with English Translation and Claims) filed Mar. 7, 2018 for Japanese Application No. 2016-573963; 12 Pages.
DCMD Instruction letter dated May 15, 2018 for JP Pat. Appl. No. 2016-573963; 1 page.
ITOH Draft Amendment dated Apr. 24, 2018 for JP Pat. Appl. No. 2016-573963; 3 pages.
Japanese Office Action (with English Translation) dated Mar. 20, 2018 for Japanese Application No. 2016-573963; 7 Pages.
Letter from NTD Patent and Trademark Agency Limited and text of Second Office Action dated May 21, 2018 for CN Pat. Appl. No. 201580032710.5; 2 pages.
Text of Second Office Action from NTD Patent and Trademark Agency Limited Letter dated May 21, 2018 for CN Pat. Appl. No. 201580032710.5; 1 page.
Claims from NTD Patent and Trademark Agency Limited letter dated May 21, 2018 for for CN Pat. Appl. No. 201580032710.5; 2 pages.
Response (with English Translation & Claims) to $2^{nd}$ Chinese Office Action dated Apr. 28, 2018 for Chinese Application No. 201580032710.5; Response filed Sep. 13, 2018; 32 Pages.

PHOTOVOLTAIC DEVICE FOR GENERATING ELECTRICAL POWER USING NONLINEAR MULTI-PHOTON ABSORPTION OF INCOHERENT RADIATION

CROSS REFERENCE TO RELATED APPLICATION

This application claims priority from U.S. Provisional Patent Application Ser. No. 62/014,489 filed on Jun. 19, 2014, which is incorporated herein by reference in its entirety.

BACKGROUND

As is known in the art, photovoltaic devices operate using a single photon absorption (SPA) process in which a photon with energy equal to or greater than the bandgap of the semiconductor body having a p-n junction generates a single electron-hole (e-h) pair, as illustrated in FIG. 1A. The photon-generated (herein sometimes referred to as "photo-generated") electron and hole are then collected for electrical power generation using a p-n junction diode. The flow of photo-generated electrons and holes across the p-n junction results in current flow through the body and generation of the voltage across the end terminals at the p and n regions of the body. The photons having energy below the bandgap energy of the semiconductor do not contribute to the generation of e-h pairs. The electric current flowing in the semiconductor body is dependent on the number of photo-generated electrons and holes. The voltage generated across the end terminals is dependent on the bandgap of the semiconductor body. A photon with energy in excess of the bandgap energy will generate an e-h pair wherein the energy excess of the bandgap energy will be eventually lost in form of heat (also known as the phononic loss). The detailed balance limit of efficiency due to all these factors provide the upper limit for energy conversion efficiency from a broad band optical source of energy (such as a hot blackbody radiator like the sun) to electrical energy. This is referred to as the Shockley-Queisser limit. For a single (one bandgap) p-n junction crystalline semiconductor device, the theoretical limiting power efficiency is approximately 31%. With a large number of stacked/tandem p-n junctions with different bandgaps (with each bandgap capturing a small section/range of photon energy from the broad band radiation), the corresponding theoretical limit increases. For a stack of 36 bandgaps, the maximum theoretical efficiency is 72% [S. M. Sze, *Physics of Semiconductor Devices*. $2^{nd}$ Edition, Page 798, John Wiley & Sons Inc., New York (1981); W. Walukiewicz, "Semiconductor Materials for Intermediate Band Solar Cells", GCEP Solar Energy Workshop, 19 Oct. 2004]. By concentrating the sunlight, one could further enhance the conversion efficiency. In September 2013, a solar cell achieved 44.7 percent efficiency with an intensity concentration equivalent to 297 suns, as demonstrated by the German Fraunhofer Institute for Solar Energy Systems [Fraunhofer-Institut fur Solare Energiesysteme ISE, Press Release, 23 Sep. 2013].

In essence, the bandgap of semiconductor single p-n junction devices can be optimized to exhibit maximum conversion efficiency for a specific black-body spectrum (depending on the temperature of the radiator). Efforts to convert a larger portion of the black-body spectrum into electrical power with efficiency exceeding the Shockley-Queisser limit use bodies with multiple bandgaps assembled vertically (such as tandem cells) or laterally (such as in systems with spectrum splitting). Current SPA photovoltaic (PV) processes that convert optical power (electromagnetic radiation) such as light from a blackbody source (such as the sun) or a source of thermal radiation (such as a flare or waste heat from a furnace) into electric power is therefore limited in its energy conversion efficiency by the fundamental Shockley-Queisser limit. Commercially available silicon solar cells that convert sunlight into electric energy exhibit conversion efficiencies approximately 20%; the highest theoretical efficiency for a single p-n junction solar cell device being limited, as noted above is approximately 31%. By increasing the concentration of the intensity of incident sunlight using a concentrator (also known as concentrator photovoltaics or CPV) technology, it is theoretically possible to enhance the efficiency to approximately 37% at an optical concentration ratio of 1000 [S. M. Sze, *Physics of Semiconductor Devices*. $2^{nd}$ Edition, Page 798, John Wiley & Sons Inc., New York (1981); G. Gabetta, "High Efficiency Photovoltaic power plants: the II-V compound solar cells, 2011 CESI]. However the light (power per unit area) concentration cannot be increased beyond a certain threshold level without the materials in the body being degraded. Another approach for enhancing the efficiency is by absorbing the broad energy spectrum from black body radiation using a series of devices with semiconductors having different bandgaps. This has been used in the PV industry for creating tandem solar cells with efficiencies close to 40% (using 3 different semiconductors placed on top of each other also known as triple junction cells). However, these devices are very expensive and work efficiently only under specific conditions.

For over four decades, intense research has been dedicated to the development of increasing effective solar cell efficiency by multi junction devices, multiple absorption path solar cells (using impact ionization multiple exciton generation), multiple energy level solar cells (using localized levels or intermediate bands), multiple spectrum solar cells (using up and down conversion of photons), multiple temperature solar cells (using utilization of hot carriers), dilute II-VI oxide semiconductor cells (ZnMnOTe), and solar thermo-photovoltaics (TPV). These SPA techniques include: 1) Stacking different band gap semiconductors to collect broader spectral bands; 2) Optimizing individual p-n junction by strategies to minimize charge carrier (electron and hole) recombination; 3) Optimizing the active region thickness by balancing absorption, non-radiative processes, radiative losses, and carrier diffusion lengths; (4) Other enhancement approaches include: modifying the surface structure of the cell and using multilayer coatings, which are designed to couple light into the structure by interference, and scatter light into oblique angles of the surface trapping weakly absorbed wavelengths; (5) Detailed suggestions have included quantum dots, but their efficiencies have not yet approached traditional methods; (6) Intermediate state cells have been fabricated, but efficiencies are below traditional levels; and (7) Multiple exciton generation via the inverse auger effect has also been demonstrated, but with poor performance in existing devices. The above approaches only provide a sub-set of the criteria that is necessary for accomplishing high efficiency device. An ideal PV device needs to satisfy the following criteria to demonstrate the highest theoretical conversion efficiency: Zero series resistance, Infinite shunt resistance, Zero surface recombination (perfectly passivated surfaces), Zero dislocations or extended defects in the PV material, Extremely high carrier lifetimes (requiring highest quality single crystal), P+I N+ structure (for efficient carrier collection), Perfect anti-reflection (AR) coating plus textured top surface, Back-surface reflector for photon recycling, Back surface field (electric) profile (for carrier confinement), preferably direct bandgap semiconductor (GaP, GaAs, InP, GaSb, CdTe, and so forth), High optical concentration, Low operation temperature. There has been a challenge on multiple fronts in spite of over 4 decades of research to accomplish many of the above criteria.

As is also known in the art, non-linear Two-Photon Absorption (TPA) is a non-linear multi-photon optical process in which two photons (from the incident radiation) each with energy less than the bandgap energy of the semiconductor having identical or different wavelength (or frequencies) are absorbed simultaneously (typically within a nanosecond) in a body whereby an electron in the body is elevated from a lower energy electron state (usually the ground state) to a higher energy electron state as illustrated in FIG. 1B; see papers by: S. Fathpour, K. Tsia and B. Jalali, "Two-Photon Photovoltaic Effect in Silicon", IEEE Journal of Quantum Electronics, vol. 43, p. 1211, 2007, and B. Jalali; S. Fathpour "Silicon Photonics", IEEE Journal of Lightwave Technology, vol. 24, p. 460, 2006; M. B. Haeri, S. R. Kingham, and P. K. Milsom, "Nonlinear absorption and refraction in indium arsenide," $J. Appl. Phys.$ 99 (1), 013514, 2006; and K. W. Berryman and C. W. Rella, "Nonlinear absorption in indium arsenide", Phys. Rev. B, 55(11), 7148-7154, 1997. The energy difference between the involved lower and upper states is equal to or less than the sum of the energies of each of the two photons as shown in FIG. 1B.

There is another fundamental difference between the nonlinear TPA and the SPA processes. More particularly, the inverse of the absorption coefficient, a, defines the average distance traveled by a photon before it is absorbed by a material. The absorption coefficient describes the photon intensity (power per unit area) as the light travels through the material by the differential equation, $$\frac{d}{dz}I(z) = -\alpha I(z),$$

where $\alpha$ is the absorption coefficient, and I(z) is the photon beam intensity at location z into the medium; where $$-\left|\frac{d}{dz}I(z)\right|$$

may be considered as the rate of intensity absorption as the light travels through the body. For photon energy equal to or exceeding the band gap of the semiconductor, the absorption coefficient for the Single Photon Absorption (SPA) process is dependent on the specific semiconductor material and the photon energy. The absorption coefficient is approximately a constant independent of the intensity of the optical beam.

At sufficiently high optical intensities, nonlinear multi-photon processes can dominate absorption. As an example, nonlinear degenerate two photon absorption (TPA) is a special case of nonlinear multi-photon processes. (The term degenerate refers to each photon having the same energy.) In this case, for two photons with each having energy less than the band gap, the nonlinear TPA process combines the photons to elevate charge carriers (electrons) from the valence band to the conduction band.

Unlike the SPA process, in the degenerate TPA process, the optical absorption coefficient (a) of the body is proportional to the optical intensity of the incident light (I) with $\alpha=\beta I$, where $\beta$ is the proportionality constant depending on the materials' properties. A simplified representation for the nonlinear degenerate TPA process can be described by a material dependent nonlinear absorption coefficient, $\beta$, which governs the TPA absorption via the simplified equation, $$\frac{d}{dz}I(z) = -\beta I^2(z).$$

Thus the distinguishing feature of degenerate TPA is that the rate of absorption of light by a material depends on the square of the light's intensity. This is different from SPA, where the rate of absorption of light is linear with respect to input light intensity.

The TPA has been used with coherent sources of radiation for a variety of applications including optical power limiters. For optical power limiters, in a material with a strong nonlinear effect, the absorption of light increases with intensity such that beyond a certain input intensity the output intensity approaches a constant value. Such a material can be used to limit the amount of optical power entering a system. This can be used to protect expensive or sensitive equipment such as sensors, can be used in protective goggles, or can be used to control noise in laser beams.

While TPA has been generated by exposing a body to coherent radiation as from a laser, the inventors have recognized providing a photovoltaic system that directly generates electrical power in response to incoherent radiation producing such electric power by nonlinear multi-photon absorption or nonlinear TPA, as for example from sunlight, would result in inexpensive, highly efficient system and method for electric power generation.

SUMMARY

In accordance with the present disclosure, a method is provided for converting incoherent optical radiation into electrical power using nonlinear multi-photon absorption.

In one embodiment, wherein the nonlinear multi-photon absorption occurs in a body and wherein the incoherent light is passed through an optical condensing system prior to passing to the body.

In one embodiment, a method is provided for generating electrical power comprising: producing multi-photon nonlinear absorption in a body, the body having a predetermined bandgap, comprising subjecting the body to photons from a source of incoherent radiation, the photon having energy below the bandgap of the body.

In one embodiment, the incoherent light has a plurality of different frequencies.

In one embodiment, the incoherent light has a continuum of different frequencies between a minimum wavelength and a maximum wavelength.

In one embodiment a method is provided comprising directing high intensity (power per unit area) incoherent energy into a body and converting incoherent broad spectral band optical energy in a body into electrical power using nonlinear multi-photon absorption process, while subjecting the body to a magnetic field.

In one embodiment a method is provided comprising directing prescribed polarization states of high intensity (power per unit area) incoherent broad spectral band energy into a body with prescribed crystal orientation and converting incoherent broad spectral band optical energy in a body into electrical power using nonlinear multi-photon absorption process, while subjecting the body to a magnetic field.

In one embodiment a method is provided comprising directing high intensity (power per unit area) incoherent broad spectral band energy into a body and converting incoherent broad spectral band optical energy in a body into electrical power using nonlinear multi-photon absorption process, while subjecting the body to an electric field.

In one embodiment a method is provided directing prescribed polarization states of high intensity (power per unit) incoherent broad spectral band energy into a body with prescribed crystal orientation and converting incoherent broad spectral band optical energy in a body into electrical power using nonlinear multi-photon absorption process, while subjecting the body to magnetic and electric fields.

In accordance with the disclosure, an electric power generating system is provided comprising: a body having a predetermined bandgap; and, an optical system having a bandpass optical filter for directing incoherent radiation, such as for example sunlight having infrared, visible and ultraviolet radiation, passing through the optical filter within a predetermined band of frequencies and with a predetermined intensity to an interior region of the body, the bandgap of the body being more than the energy of photons in the passing radiation, the intensity in the body being sufficient to operate the body in a nonlinear multi-photon absorption mode.

In accordance with the present disclosure, a method is provided comprising converting incoherent optical energy into electrical power using nonlinear multi-photon absorption.

In one embodiment, a method is provided for generating electrical power comprising: producing multi-photon nonlinear absorption in a body, the body having a predetermined bandgap, comprising subjecting the body to photons from a source of incoherent radiation, the photon having energy below the bandgap of the body.

In one embodiment, the nonlinear multi-photon absorption occurs in a body and producing the nonlinear multi-photon absorption in the body.

In one embodiment, the nonlinear multi-photon absorption occurs in a body having predetermined bandgap energy and wherein the incoherent optical energy comprises photons having energy levels less than the predetermined bandgap energy.

In one embodiment, the body is a semiconductor body.

In one embodiment, the nonlinear multi-photon absorption generates carriers comprising electrons and holes and including providing electrical circuitry external to the body to provide an electrical path for the carriers.

In one embodiment, the body is provided with a pair of electrodes in ohmic contact with the body and wherein the electrical path is provided between the pair of electrodes.

In one embodiment, the optical energy has an optical flux on the order of $10^5$ W/cm$^2$.

In one embodiment, the body is an elemental, binary, ternary, quaternary or higher order composition semiconductor body.

In one embodiment, a method is provided for producing nonlinear multi-photon absorption in a body having a predetermined bandgap energy comprising subjecting the body to a source of incoherent electromagnetic radiation having photons with energy levels less than the predetermined bandgap energy producing a flow of carriers within the body; and coupling the carriers to a load external to the body.

In one embodiment, the incoherent light is multi-frequency incoherent light wherein the nonlinear multi-photon absorption is a combination of degenerate and nondegenerate two-photon absorption (TPA).

In one embodiment, the incoherent electromagnetic radiation has a plurality of different frequencies and the nonlinear multi-photon absorption generates carriers comprising electron-hole pairs and including providing electrical circuitry external to the body to provide an electrical path for the carriers.

In one embodiment, the incoherent electromagnetic radiation has a continuum of different frequencies and the nonlinear multi-photon absorption generates carriers comprising electron-hole pairs and including providing electrical circuitry external to the body to provide an electrical path for the carriers.

In one embodiment, the method includes subjecting a body to a source of incoherent electromagnetic radiation having photon energies, $E_k$, associated with photon intensities (power per unit area), $I_k$, having sufficient intensities to produce N-multiphoton absorption of power P within the body at a rate proportional to the product of the N photon intensities, $I_1 \times I_2 \times \ldots \times I_N$, where N is greater than 1, producing electron-hole pairs in the body from the absorbed power; and converting the electron-hole pairs into an electrical potential across the body.

In one embodiment, the method includes subjecting a body to a source containing a plurality of multi-frequency incoherent electromagnetic radiation having photon energies, $E_k$, associated with photon intensities (power per unit area), $I_k$, having sufficient intensities to produce N-multiphoton absorption of power P within the body at a rate proportional to the product of the N photon intensities, $I_1 \times I_2 \times \ldots \times I_N$, where N is greater than 1, producing electron-hole pairs in the body from the absorbed power; and converting the electron-hole pairs into an electrical power for a load external to the body, In one embodiment, the method includes subjecting a body to a source containing a continuum of multi-frequency incoherent electromagnetic radiation having photon energies, $E_k$, associated with photon intensities (power per unit area), $I_k$, having sufficient intensities to produce N-multiphoton absorption of power P within the body at a rate proportional to the product of the N photon intensities, $I_1 \times I_2 \times \ldots \times I_N$, where N is greater than 1, producing electrons and holes in the body from the absorbed power; and converting the electrons and holes pairs into an electrical current external to the body.

In one embodiment, a photovoltaic device is provided, comprising: a body; a source of multi-frequency incoherent light directed onto the body, the light having photon energies, $E_k$, associated with photon intensities (power per unit area), $I_k$, having sufficient intensities to produce N-multiphoton absorption of power P within the body at a rate proportional to the product of the N photon intensities, $I_1 \times I_2 \times \ldots \times I_N$, where N is greater than 1, producing carriers in the body from the absorbed power; and an electrode connected to the body to receive the carriers and produce an electric current external of the body.

In one embodiment, the method includes subjecting the body to an electric field.

In one embodiment, a method comprises converting optical energy into electrical power using nonlinear multi-photon absorption in a body and during such absorption subjecting the body to an electric field which enhances the transition probability of photon to electron-hole carrier conversion.

In one embodiment, the method includes subjecting the body to a magnetic field.

In one embodiment, the magnetic field results Landau level energy states in the body.

In one embodiment, a method comprises converting optical energy into electrical power using nonlinear multi-photon absorption in a body and during such absorption, subjecting the body to a magnetic field.

In one embodiment, the method includes subjecting the body simultaneously to both an electric field and a magnetic field.

In one embodiment, an electrical circuit is provided comprising: a source of incoherent radiation having a photon with a predetermined energy; and a photovoltaic device having a bandgap more than the predetermined energy of the photon, the device being positioned to receive the photon having the predetermined energy to operate in a nonlinear multi-photon absorption mode.

In one embodiment, an electrical circuit is provided, comprising: a photovoltaic device comprising a body; a source of photons; a source of a magnetic field; wherein the photovoltaic device converts photon energy from the photons into electrical power using nonlinear multi-photon absorption in the body and during such absorption body is subjected to the magnetic field; and an electrical device connected across the photovoltaic device.

In one embodiment, an electrical circuit is provided, comprising: a photovoltaic device comprising a body; a source of photons; a source of an electric field; wherein the photovoltaic device converts photon energy from the photons into electrical power using nonlinear multi-photon absorption in the body and during such absorption body is subjected to the electric field; and an electrical device connected across the photovoltaic device.

In one embodiment, an electrical circuit is provided, comprising: a photovoltaic device comprising a body; a source of photons; a source of a magnetic and electric field; wherein the photovoltaic device converts photon energy from the photons into electrical power using nonlinear multi-photon absorption in the body and during such absorption body is subjected to the magnetic field and electric field; and an electrical device connected across the photovoltaic device.

The method uses the nonlinear multi-photon absorption (MPA) such as two-photon absorption (TPA) processes in bodies, such as semiconductor bodies, to utilize the photons with energy less than the semiconductor bandgap and hence capturing a large portion of the blackbody radiation to generate electrical power.

A method and photovoltaic device are provided for converting optical energy into electrical power using nonlinear below bandgap energy multi-photon absorption while the body is subjected to a magnetic field. The application of the magnetic field removes degeneracies in the semiconductor conduction, intermediate, and valence bands. Removing degeneracies enables the TPA transition coefficient to exhibit peaks at transitions between the magnetic Landau levels. The transition rates are subject to magnetic quantum number selection rules. The landau transitions correspond to resonant transitions, which will greatly increase the transition rate and photogenerated electron-hole current.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 11A-11B showing relative orientations of the illumination beam propagation directions; illumination polarization states; p-n junction interface, and p-n junction depletion region electric field in accordance with another embodiment of the disclosure;

Like reference symbols in the various drawings indicate like elements.

DETAILED DESCRIPTION

Figure 1A:
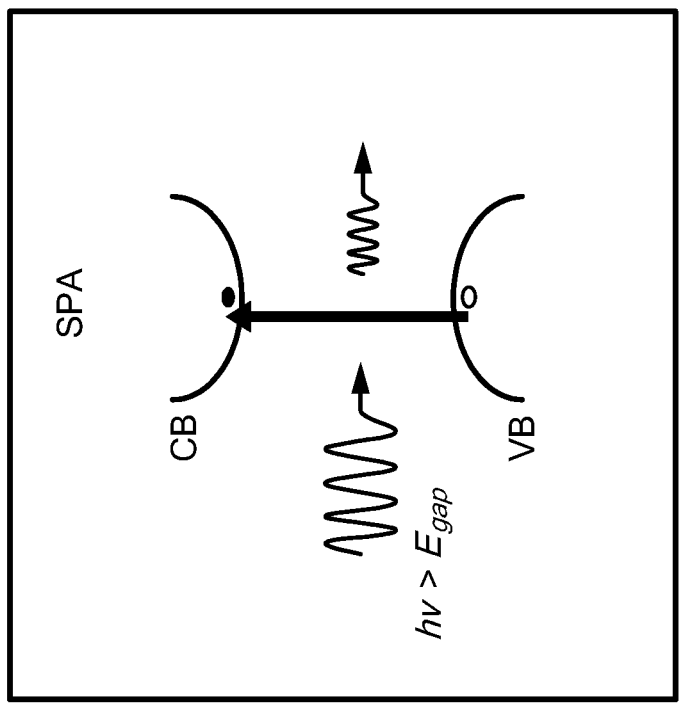
FIG. 1A is a diagram illustrating single photon absorption (SPA) in a body.
Figure 1B:
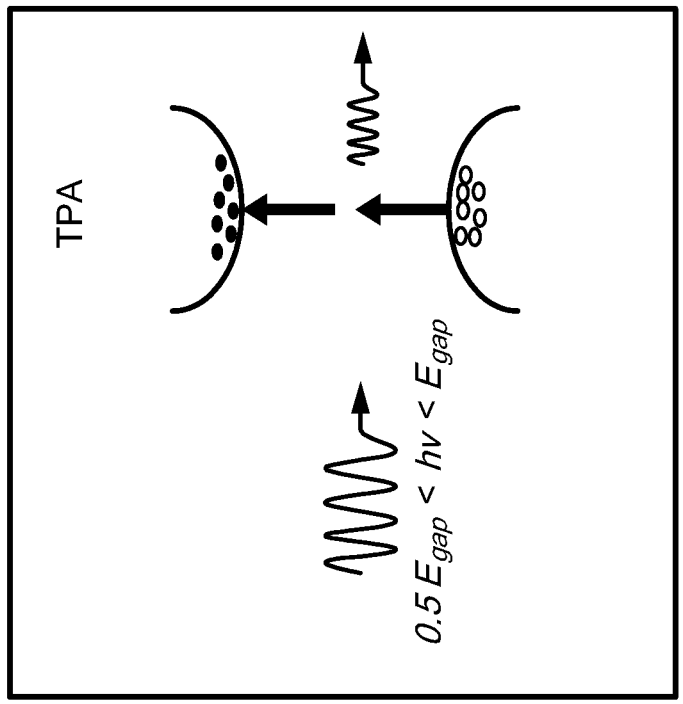
FIG. 1B is a diagram illustrating two photon absorption (TPA) in a body.
Figure 2:
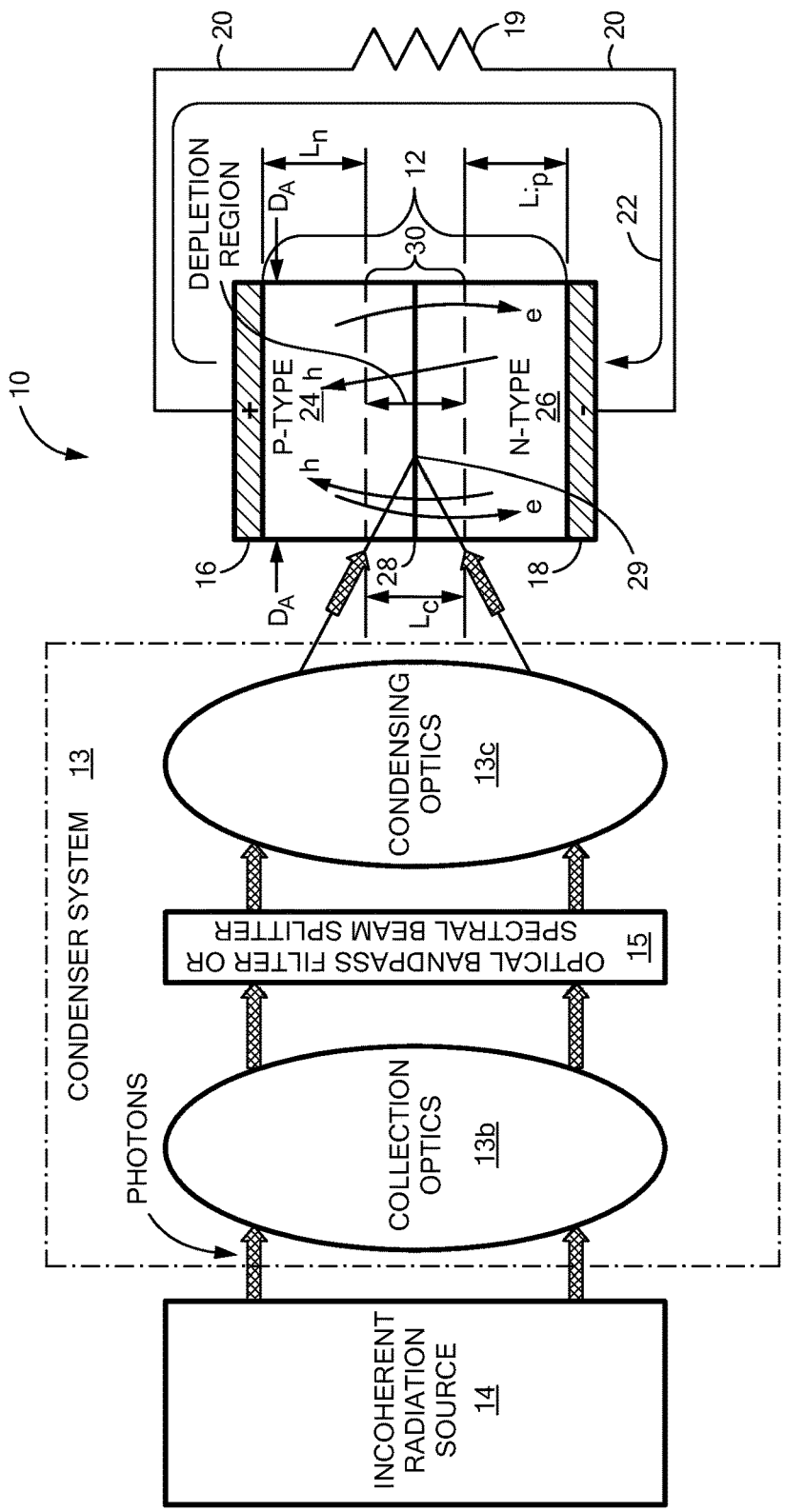
FIG. 2 is a diagram of a system for converting incoherent optical radiation into electrical power using nonlinear multi-photon absorption according to the disclosure.

Referring now to FIG. 2, a photovoltaic device 10 is shown having a body 12; a source 14 of light, here for example, a blackbody radiator of incoherent radiation, for example, the sun, or a source of thermal radiation (such as a flare or waste heat from a furnace) directed onto the body 12 through a condenser optical system 13. The condenser optical system 13 includes radiation collection optics (13b), an optical spectral filter (15), and condensing or concentrating optics (13c). The body 12 is a semiconductor body, to be described, having a predetermined bandgap. The condenser optical system 13 collects and focuses the light from source 14 which passed through a bandpass optical filter or spectral beam splitter 15 onto the body 12. The optical filter or spectral beam splitter 15 has a frequency response designed to pass to the body 12 from the condensing optics 13c the portion of the incoherent radiation from the source 14 having photons with a predetermined energies lower than the predetermined bandgap of the body 12 and with sufficient intensity I (power per unit area) within the body 12 to have the body 12 operate in a nonlinear multi-photon absorption mode, with photon energies, $E_k$, associated with photon intensities, $I_k$, having sufficient intensities to produce N-multiphoton absorption of power P within the body at a rate proportional to the product of the N photon intensities, $I_1 \times I_2 \times \ldots \times I_N$, where N is greater than 1, producing carriers in the body 12 from the absorbed power. Here, for example, the filter 15 may be a multi-layer interference, a rugate filter, a prism or a diffraction grating. To provide maximum efficiency, the light rejected from the filter (or spectral beam splitter) can be directed to another linear or nonlinear photovoltaic device (not shown). The body 12 has a pair of electrodes 16, 18 connected to the body 12 to receive the electrical charge carriers and produce an electric current through a load 19, here represented by a resistor, connected, externally of the body 12, to the electrodes 16, 18 by electrical conductive wires 20, as shown to provide a completed current carrying circuit indicated by the arrow 22. More particularly, the body 12 has predetermined bandgap energy. Here, for example, the body 12 is a single crystal semiconductor body having a p-type region 24 and an n-type region 26 forming a p-n junction 28 and with a resulting depletion region 30 being generated in the body 12, as shown. Here, in this example, the body 12 is a Group or Column III-V semiconductor, for example indium phosphide (InP) P-N junction structure or a ternary material, such as, for example, $Ga_xIn_{1-x}As$ (with 0<x<1) semiconductor. Here, for example, the n-type region 26 is doped with, for example Tellurium (Te), having for example a doping concentration of $1 \times 10^{17}$ cm$^{-3}$; and the p-type region 24 is doped with Zinc (Zn) having, for example, a doping concentration of $5 \times 10^{17}$ cm$^{-3}$. The electrodes 16, 18 are in ohmic contact with the p-type region 16 and n-type region 18, respectively as shown.

More particularly, here, for example, the bandpass filter or spectral beam splitter 15 passes the incoherent radiation-having a wavelength greater than 1.06 µm (corresponding to photon energy less than 1.17 eV). The optical beam is collected and focused onto a spot 29 in the center of the depletion region of the body 12. It is noted that the energy of the photons in the optical radiation is less than the bandgap of the InP which is 1.344 eV at 300 K (room temperature)

Thus, the electrical circuit includes: the photovoltaic device 10 operating in a nonlinear multi-photon absorption mode; and the load 19 connected across the photovoltaic device 10. More particularly, the body 12 operates in a nonlinear multi-photon absorption mode by subjecting the body with the intensity I of the light impinging on the body 12 with photons having energy less than the predetermined bandgap energy of the body 12, here, for example, photons having energy less than E where E is the bandgap energy of the body 12, and with photon energies, $E_k$, associated with photon intensities, $I_k$, having sufficient intensities to produce N-multiphoton absorption of power P within the body at a rate proportional to the product of the N photon intensities, $I_1 \times I_2 \times \ldots \times I_N$, where N is greater than 1, producing electron (e)-hole (p) pairs in the body 12. Here, the condensing optics 13c increases the intensity I in the depletion region 30 to an optical flux in the range of $10^5$ to $1\times10^7$ watts per cm$^2$.

It is noted that the contact metals should be as close as possible to the electron-hole pair generation volume within the body. The presence of intrinsic in-built electric field (due to depletion region) will help separate the electron-hole pairs. If the photon beam is absorbed outside the depletion region, the electron-hole pair recombination (after generation) must be avoided. The region where the photon beam should be preferably focused or absorbed is determined by the diffusion length of electrons and holes in the p-type and n-type sides, respectively of the semiconductor body. For example, Indium Phosphide (InP) with low doping concentration of impurities for n-type and p-type regions, electron lifetime=$2\times10^{-9}$ seconds and hole lifetime=$3\times10^{-6}$ seconds, resulting in hole diffusion length of 40 microns; and an electron diffusion length of 8 microns [Online material properties reference: http://www.ioffe.ru/SVA/NSM/Semicond/InP/electric.html]. Typical depletion region width in semiconductors is less than 0.5 µm corresponding to doping levels of $10^{16}$ cm$^{-3}$ or higher for the p-type and n-type regions. Hence the spot size of the focused radiation should be less than the smallest diffusion length of the carriers (8 µm in this example). Preferably the location of the spot must be centered within the depletion region and the spot size of the focused radiation should be less than the depletion region width (less than 0.5 µm). The longitudinal dimension (in the direction of light travel) where the photons are being absorbed is dictated by the nonlinear absorption coefficient β. For InP, this is approximately 100 µm for photons with energy of half the bandgap energy. It is noted that the contacts 16, 18 need to be "in the proximity" (i.e., in the range of 0.2 to 0.3 µm) of the electron-hole pair generation region, spot 29, to effectively collect all the carriers. If the metals are far away from the generation volume, the carriers will diffuse and recombine before collection. Here, in this example, the spot size is 10 microns in diameter. The point where the spot 29 is focused is a function of: the wavelength of light used for TPA; the material's TPA absorption coefficient; the mobility of electrons and holes in the selected material; the intensity of light, the generation volume and the size of spot 29 of the focused light).

Figure 3:
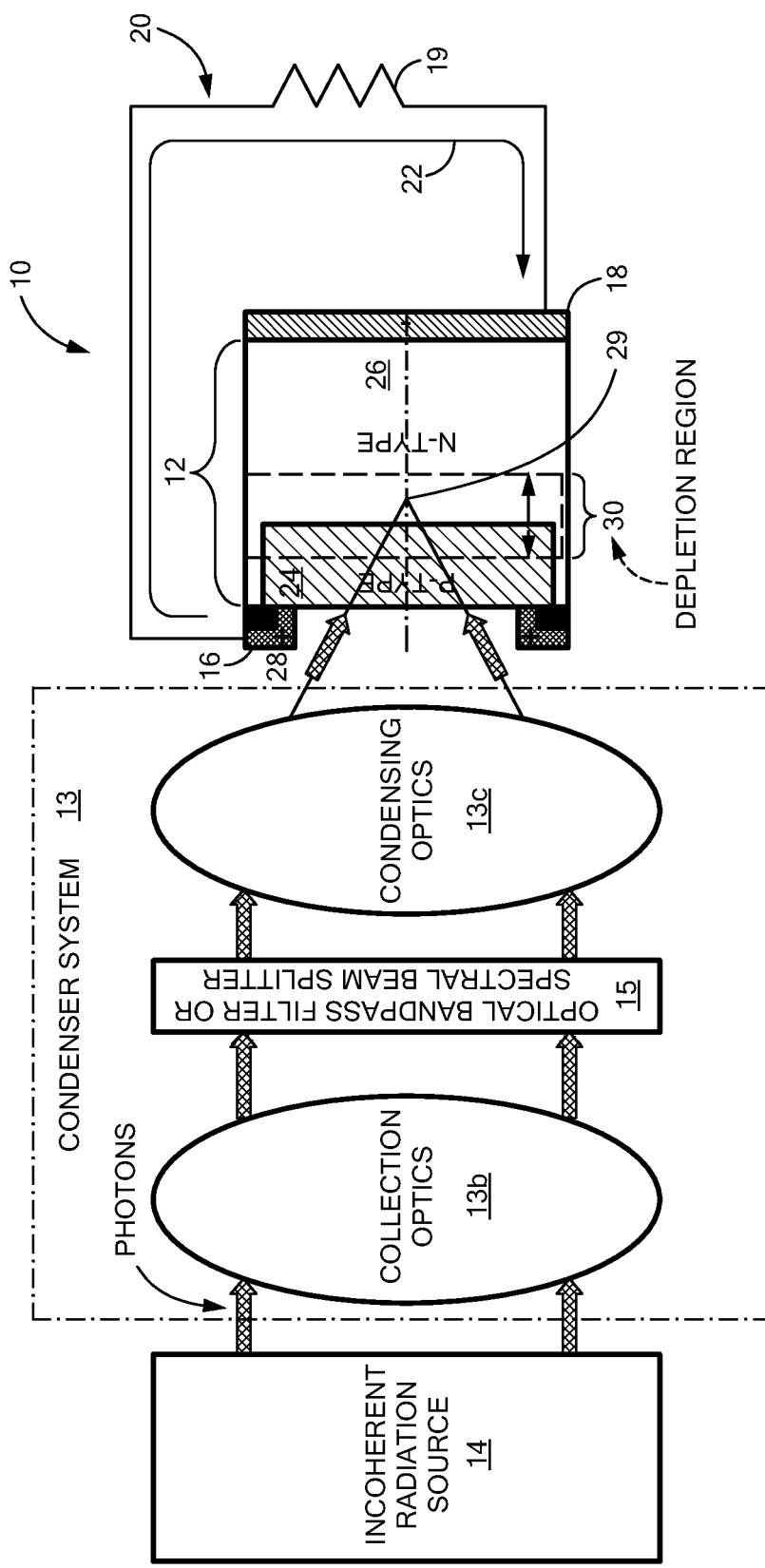
FIG. 3 is a diagram of a system for converting incoherent optical radiation into electrical power using nonlinear multi-photon absorption wherein an alternative p-n junction of a body used as a photovoltaic device in FIG. 2 provides a larger depletion area transverse to beam propagation direction than that in FIG. 2 according to another embodiment of the disclosure.

In the event that light sources are being observed that require a larger transverse focused spot size than described in the previous example, one embodiment can utilize an alternative topology of the p-n junction as depicted in FIG. 3, here using an annular electrode 16. All elements in the alternative p-n junction have the same function as described in FIG. 2; here, however the alternative arrangement permits a larger depletion region perpendicular to the direction of radiative illumination.

Figure 4:
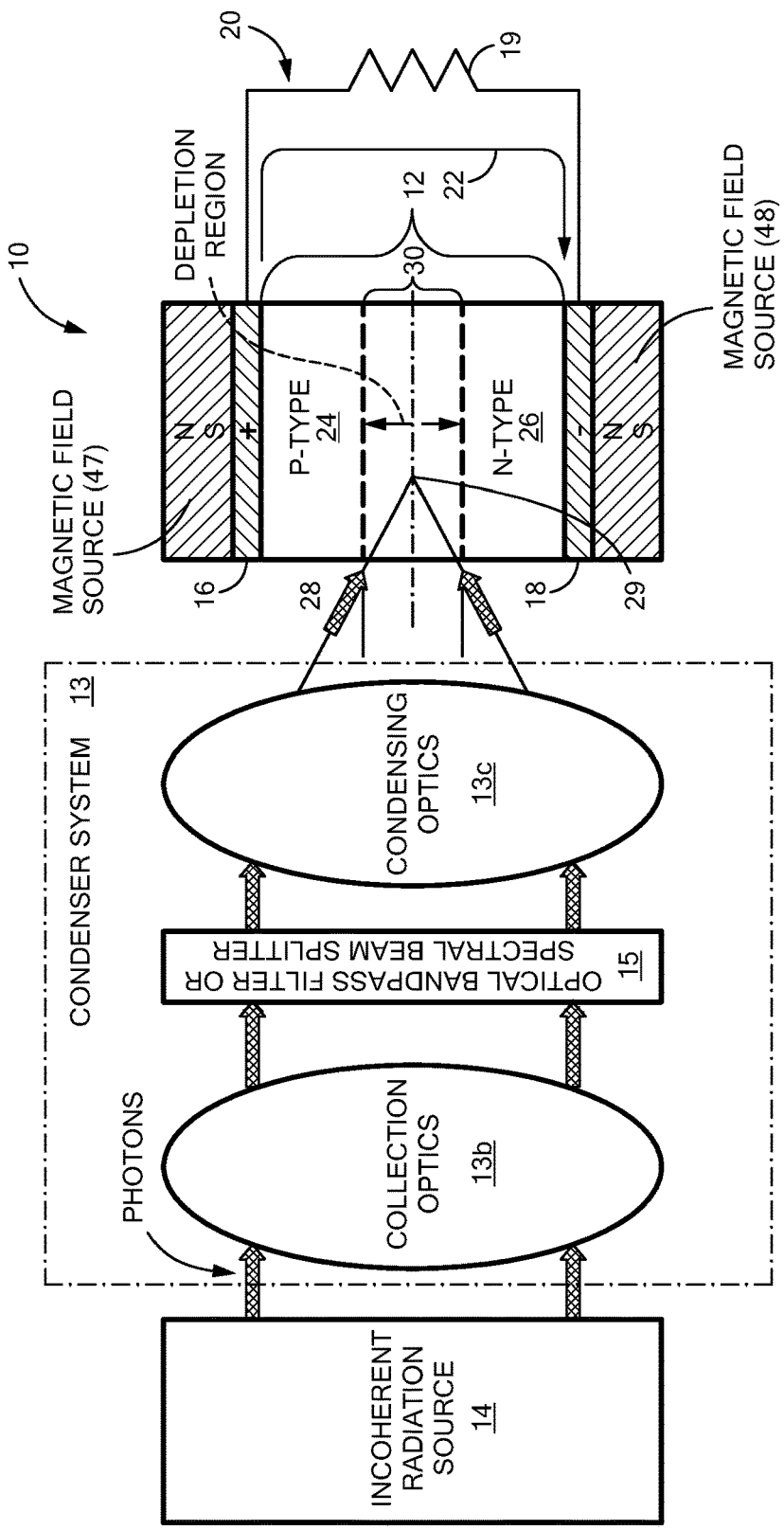
FIG. 4 is a diagram of a system for converting incoherent optical radiation into electrical power using nonlinear multi-photon absorption with the body used as a photovoltaic device in FIG. 2 having a magnetic field applied according to another embodiment of the disclosure.
Figure 4B:
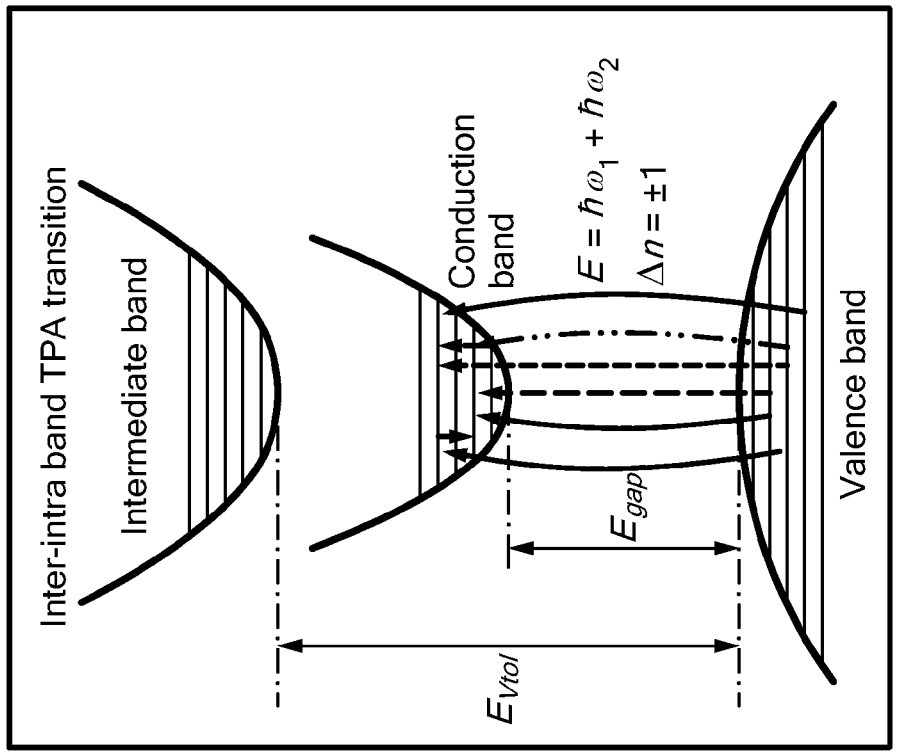
FIGS. 4A and 4B depict inter-inter band and inter-intra band TPA transitions between Landau levels typical of a direct band gap semiconductor in the presence of magnetic field in the system of FIG. 4.
Figure 4A:
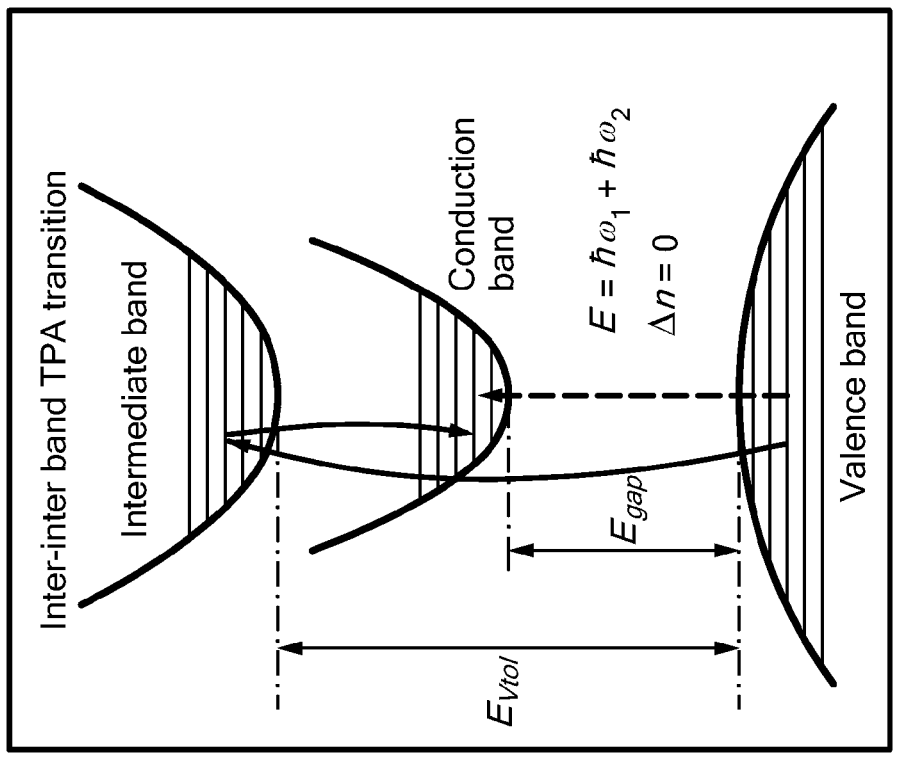
Figure 5:
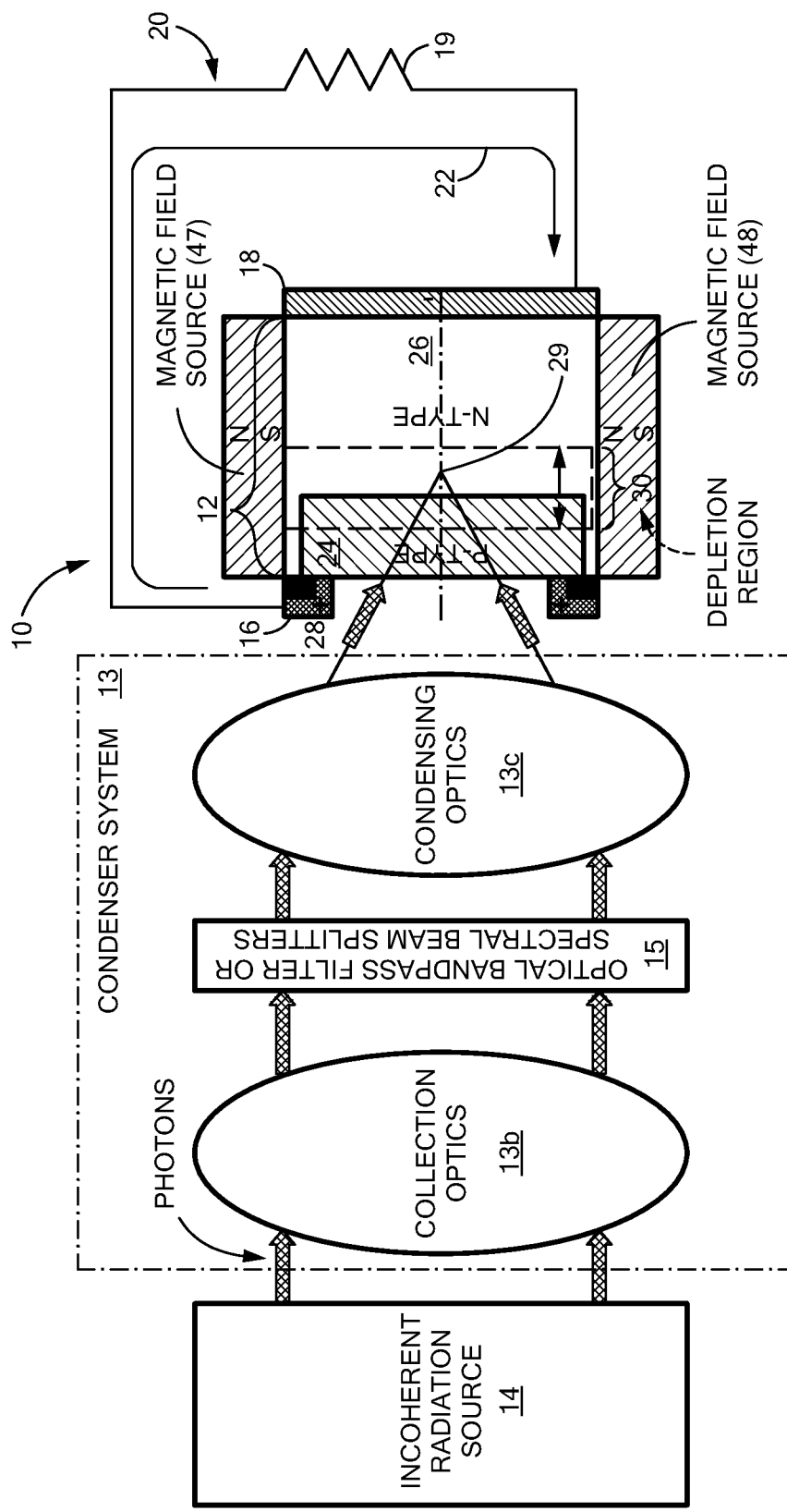
FIG. 5 is a diagram of a system for converting incoherent optical radiation into electrical power using nonlinear multi-photon absorption with the body used as a photovoltaic device in FIG. 2 having a magnetic field applied according to another embodiment of the disclosure, the body having a p-n junction topology different from the p-n junction topology of FIG. 4 applied according to another embodiment of the disclosure.

Referring now to FIGS. 4 and 5, wherein the system of FIG. 2 includes, additionally magnetic field sources (47) and (48), here for example, permanent magnets; the body in FIG. 4 having a p-n junction topology different from the p-n junction topology of FIG. 5. The application of an external magnetic field, provided by permanent magnets, removes degeneracies in the semiconductor conduction, intermediate, and valence bands. Removing degeneracies enables the TPA transition coefficient to exhibit peaks at transitions between the magnetic Landau levels. The transition rates are subject to magnetic quantum number selection rules. For direct bandgap semiconductors, the rules correspond to transitions from valence band to the conduction band via intermediate states, or transitions occurring between Landau levels of the valence and conduction bands within intermediate virtual Landau levels in either the valence or conduction band. The Landau transitions correspond to resonant transitions, which will greatly increase the transition rate. Mechanisms for direct and indirect gap semiconductors are slightly different, since the indirect gap semiconductors require interaction with phonons to satisfy the conservation of momentum. A depiction of the TPA band structure and the TPA transitions utilizing the Landau levels induced by the presence of external magnetic field for direct band gap semiconductors is shown in FIGS. 4A, and 4B.

For direct gap semiconductors the increase in transition rates caused by the Landau resonances is proportional to the square of the magnetic field strength. For indirect band gap semiconductors, the magnetic field benefits range from the square of the magnetic field strength to the fourth power of the magnetic field strength, thereby providing large potential benefit for increased carrier generation. To achieve optimum benefit for the magnetic field affects, the device architecture must incorporate optimum polarization orientations between the impinging photon electric field and the applied magnetic field. The polarization orientation optimization can be achieved in the condenser system optics (15a-15e) of FIG. 6A and FIG. 6B. The symmetry properties of the semiconductor crystal will also influence the nature of the polarization dependence of the multi-photon process.

For the direct band gap semiconductors, with magnetic quantum number n, the inter-inter band two photon transition, $\Delta n=0$, will not have a polarization effect if the semiconductor has cubic symmetry. If the crystal is anisotropic then the polarization dependence can be significant and should be considered in the design process. The inter-inter absorption has resonances at the cyclotron frequency associated with the magnetic field strength and depends linearly on the magnetic field strength. The inter-intra transitions, $\Delta n=\pm1$, also has resonances at the cyclotron frequency and increases quadratically with the magnetic field strength. In addition the inter-intra transitions require at least one of the interacting photons to be perpendicular to the magnetic field. Utilizing incoherent randomly polarized broad spectral band sources guarantees that some photons will be perpendicular to the magnetic field.

Figure 6A:
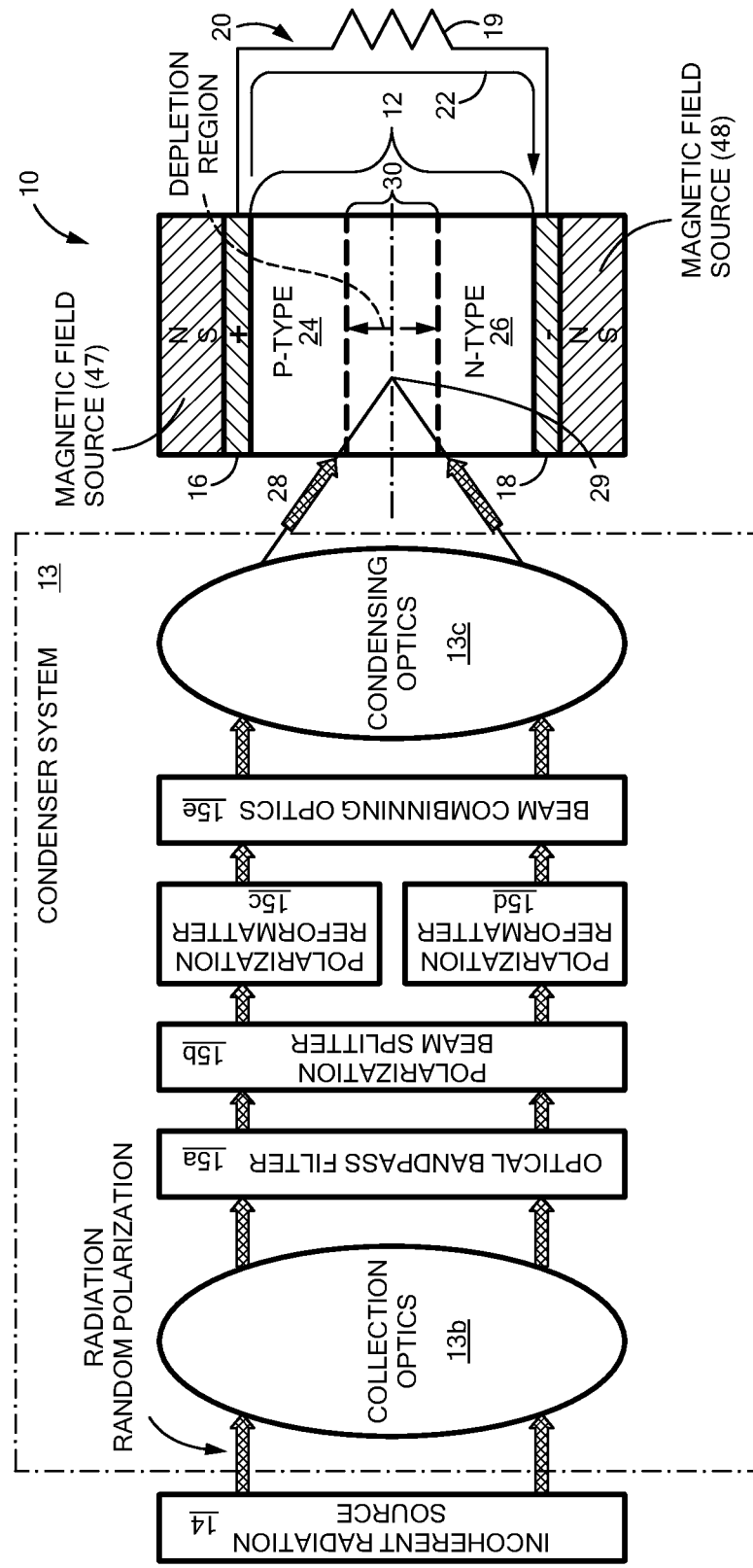
FIG. 6A is a diagram of a system for converting incoherent optical radiation into electrical power using nonlinear multi-photon absorption with the body used as a photovoltaic device in FIG. 2 having an condenser optical structure for achieving enhanced performance by accommodating random or fixed polarization states of the incoherent radiation source applied according to another embodiment of the disclosure.
Figure 6B:
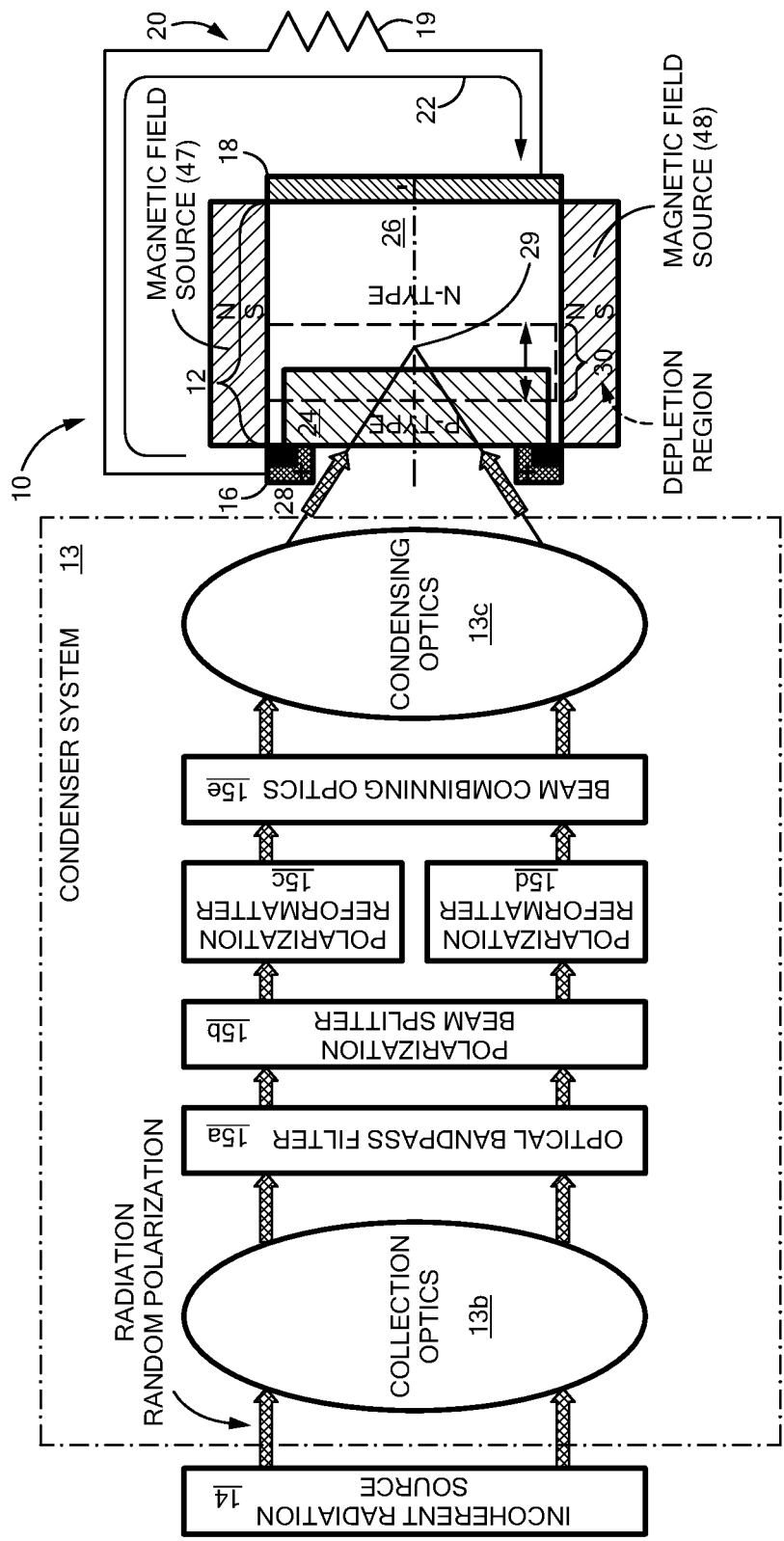
FIG. 6B is a diagram of a system for converting incoherent optical radiation into electrical power using nonlinear multi-photon absorption with the body used as a photovoltaic device in FIG. 2 having an condenser optical structure for achieving enhanced performance by accommodating random or fixed polarization states of the incoherent radiation source applied according to another embodiment of the disclosure; the body having a p-n junction topology different from the p-n junction topology of FIG. 4 applied according to another embodiment of the disclosure.

An alternative embodiment designed to enhance the polarization sensitivity of the nonlinear TPA process in the presence of magnetic fields while utilizing photons from incoherent sources with fixed or random polarizations is shown in FIG. 6A and FIG. 6B. Here the condenser system optics 15 in the system of FIGS. 4 and 5 include a polarization beam splitter (15b), which separates the incoming radiation into the two independent polarizations states of choice, and polarization reformatting devices, (15c and 15d), that take the separate polarized beams and convert the existing polarization state to the desired polarization state which optimizes the nonlinear TPA process by accounting for the magnetic field orientation and the semiconductor crystal symmetry and orientation. FIG. 6B is a diagram of a system for converting incoherent optical radiation into electrical power using nonlinear multi-photon absorption with the body used as a photovoltaic device in FIG. 6A having an condenser optical structure for achieving enhanced performance by accommodating random or fixed polarization states of the incoherent radiation source applied according to another embodiment of the disclosure the body having a p-n junction topology different from the p-n junction topology of FIG. 4 applied according to another embodiment of the disclosure.

Due to the interaction of the photons, electrons, and crystal phonons the description of indirect band gap semiconductors in the presence of a magnetic field is more complex, typically requiring four or more band structures in their analysis. However, the states of polarization and optimization of the device performance can follow the same process as described previously for direct band gap semiconductors and depicted in FIGS. 6A and 6B.

Figure 7:
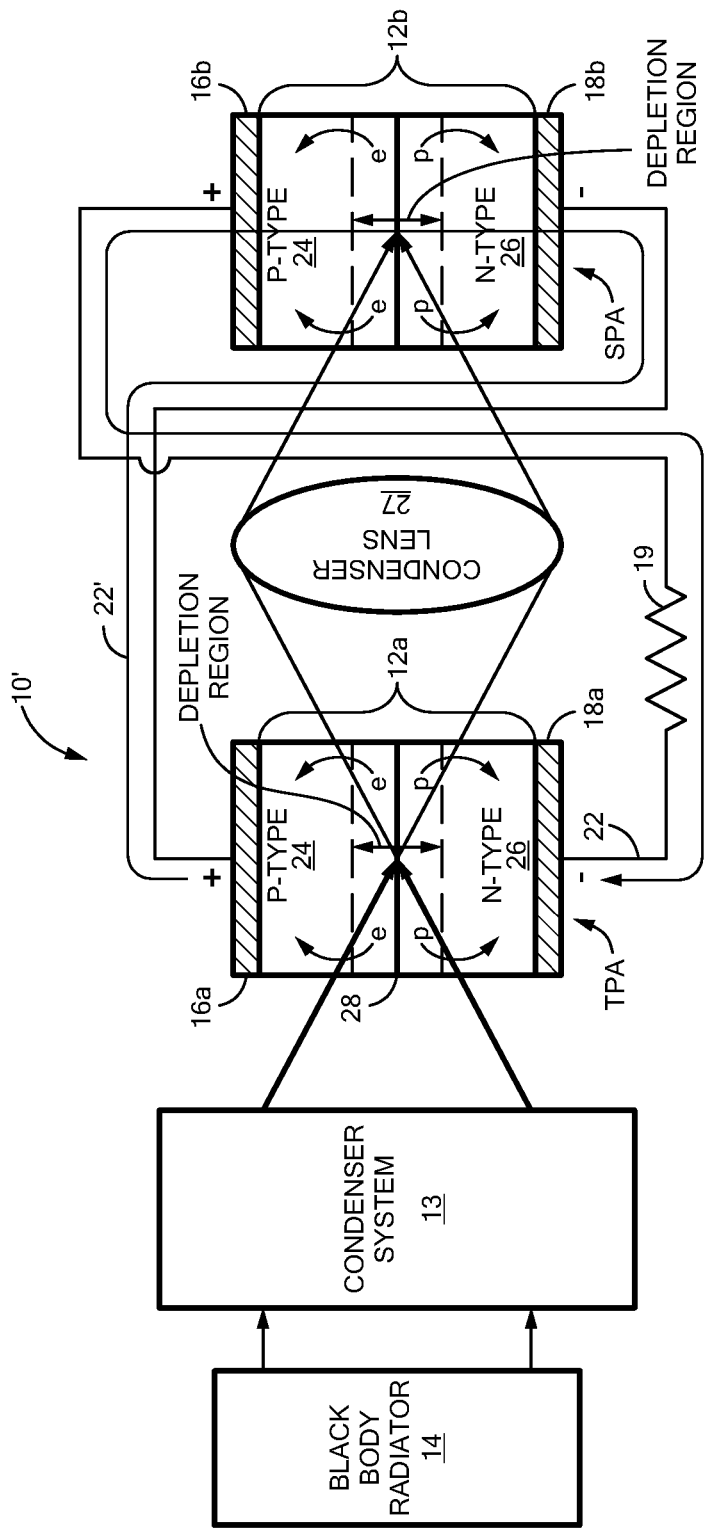
FIG. 7 is a diagram of a system for converting incoherent optical radiation into electrical power using nonlinear multi-photon absorption using a pair of stacked bodies in accordance with another embodiment of the disclosure.
Figure 8:
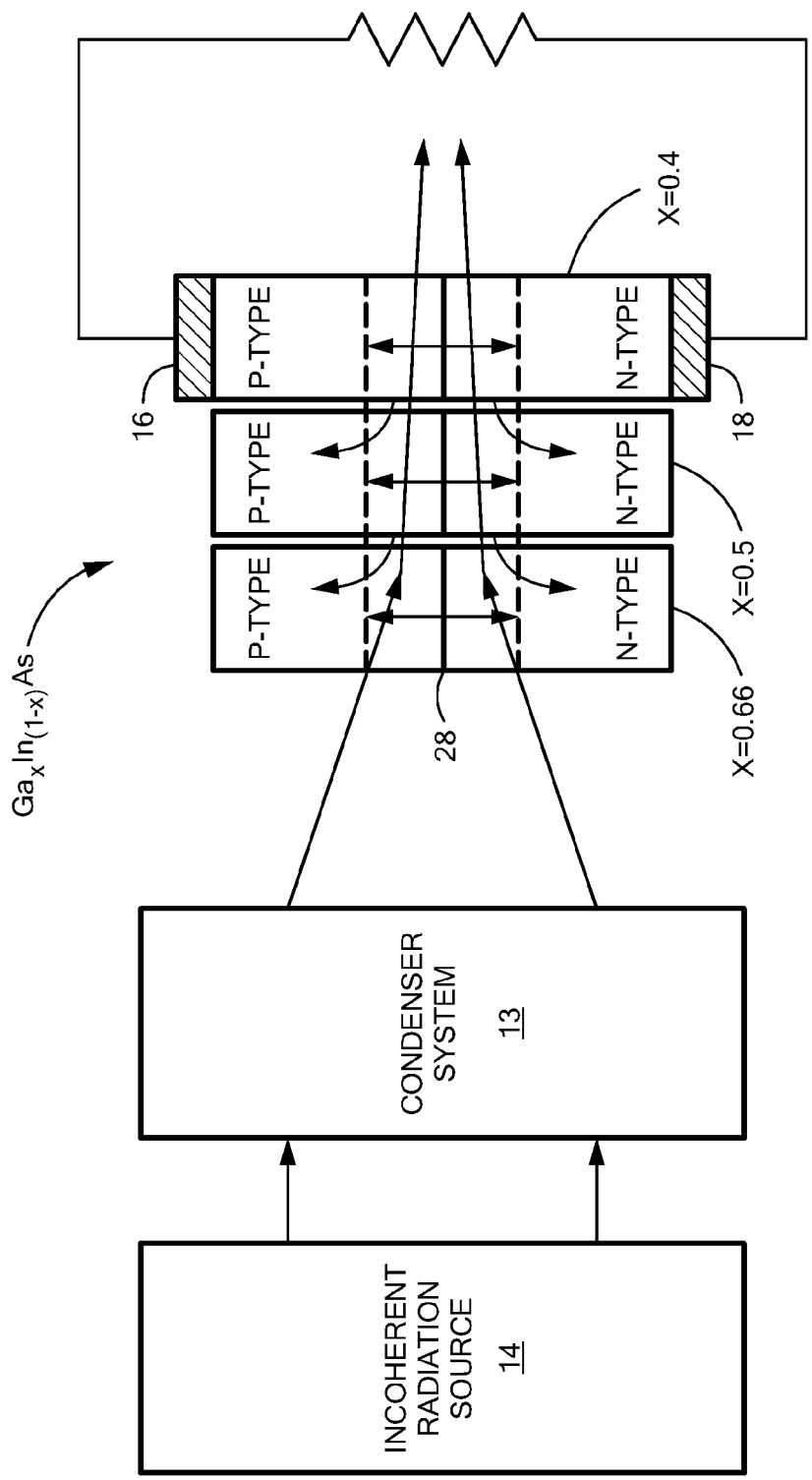
FIG. 8 is a diagram of a system for converting incoherent optical radiation into electrical power using nonlinear multi-photon absorption using a pair of stacked bodies in accordance with another embodiment of the disclosure.
Figure 9:
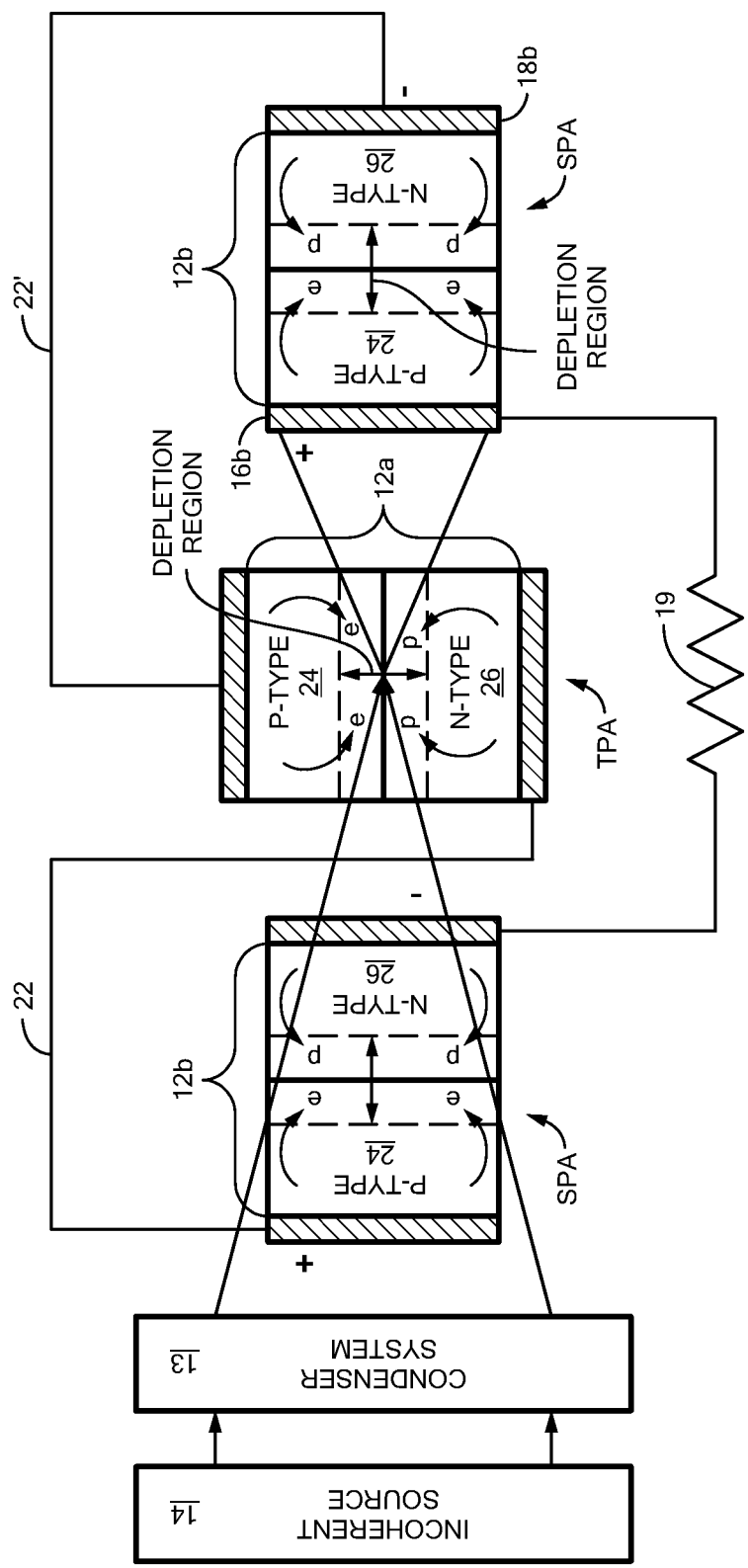
FIG. 9 is a diagram of a system for converting incoherent optical radiation into electrical power using nonlinear multi-photon absorption in a body disposed between a pair of bodies operating with using a pair of stacked bodies using single photon absorption (SPA) in a hybrid arrangement in accordance with another embodiment of the disclosure.

FIGS. 7 to 9 show various ways to accomplish hybrid SPA/TPA (FIG. 9) and stacked TPA devices (FIGS. 7 and 8), respectively, to accomplish highest overall power conversion efficiency approaching the thermodynamic Carnot efficiency limit. In particular, FIG. 7 depicts a photovoltaic device 10' with a condenser lens 27 disposed between a first body 12a that uses TPA and a second body 12b that uses SPA. FIG. 8 depicts three bodies that use TPA. FIG. 9 depicts two bodies 12b that use SPA and a body 12a that uses TPA disposed between the two bodies 12b. This disclosure describes the use of nonlinear two photon absorption (TPA), initiated using broad spectral band incoherent source photons propagated through an optical concentrator, to generate large photo currents efficiently. To increase the photo-charge carrier generation rate and reduce the optical concentration ratio needed for significant TPA current production, electric fields, magnetic fields, or simultaneous magnetic and electric fields are incorporated into the device architecture. Due to the high intensity level required to initiate TPA processes, LASER light is commonly used for applications such as optical limiters, TPA was not a serious consideration for the conversion of solar photon energy to electrical power. This is due to the ineffectiveness of TPA for low intensity absorption when compared to SPA. TPA for solar energy conversion is possible by creating ultra-high optical concentration of sunlight to reach photon intensity levels necessary for efficient TPA charge carrier generation; here with the condenser systems described above, for example. Using commercial combustion source of waste heat radiation combined with optical concentrators could also provide sufficient optical intensity for efficient TPA based electrical power generation.

Due to the greater absorption by free carriers, linear SPA from continuous wave (CW) sources causes material damage at significantly lower optical intensity levels than nonlinear TPA. The semiconductor damage threshold for TPA has been demonstrated to be 10 to 100 times higher than from SPA. Therefore, the nonlinear TPA can generate higher photo-currents, more efficiently, before reaching damage thresholds of the semiconductor material.

Features providing enhanced TPA performance, include, but not limited to utilization of: 1) Incoherent light illumination; 2) Broad spectral band illumination; and 3) Applied magnetic fields, electric fields, or combinations of magnetic and electric fields.

Due to the high optical intensities required to generate TPA charge carriers, TPA charge carrier production is traditionally the domain of laser illuminators. In fact, all measurements of the TPA transition rate (directly proportional to the charge carrier production rate) have used coherent laser sources. For the degenerate photon case (i.e., two photons having the same energy and the sum of their energies being greater than or equal to the semiconductor band gap energy) the two photon transition rate is proportional to the quantum field second order coherence (which is the product of four electric field operators). The second order coherence for random incoherent light, as derived from natural blackbody sources, is a factor of 2 larger than for coherent light, which increases the photo carrier production rate by a factor of two, as the beam propagates through the semiconductor.

Figure 10:
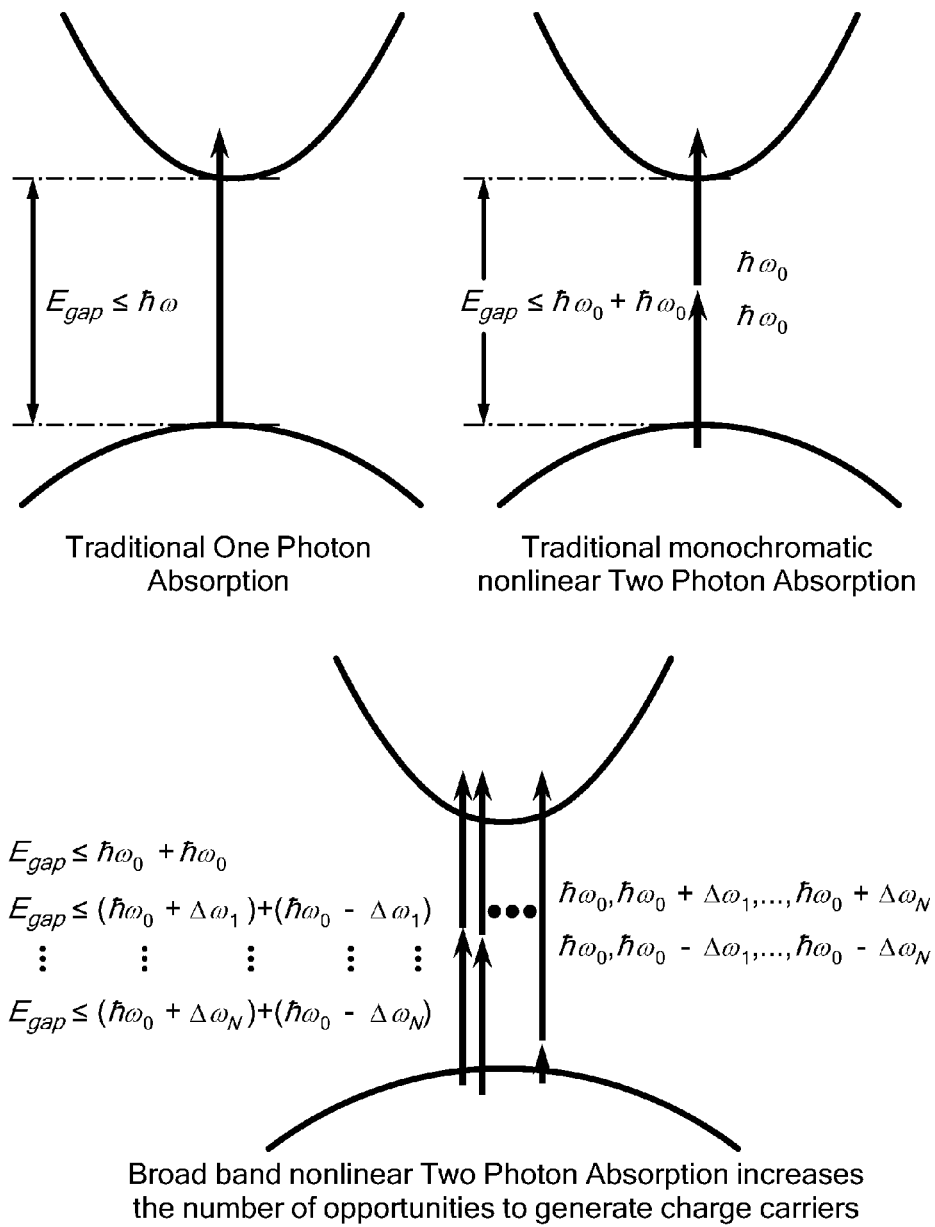
FIG. 10 show the benefits of multi-spectral Two Photon absorption and multi-photon absorption.

TPA carrier generation can be performed with any two photons derived from common or independent sources (FIG. 10) as with a broadband, multi-frequency, or continuum frequency incoherent source. Common experiments utilize one laser beam source (degenerate case, same energy photons) or two laser beam sources (non-degenerate, different energy photons). However, for a broad band source, any two photons within the spectral range with sufficient combined energy to exceed the band gap can produce charge carriers. The number of possible pair wise combinations having energies greater than or equal to the semiconductor band gap is astronomically large and will greatly exceed the potential number of single beam or double beam TPA opportunities. The TPA transition rate is proportional to the product of photon energies, and the product of number of photons in each energy state. The highest transition rate photon combinations will generate carriers at the highest rate, the next highest transition rate generating the next highest and so forth. The depletion of photons from the broadband beam will continue until the possible energetic permutations have been consumed.

Figure 11A:
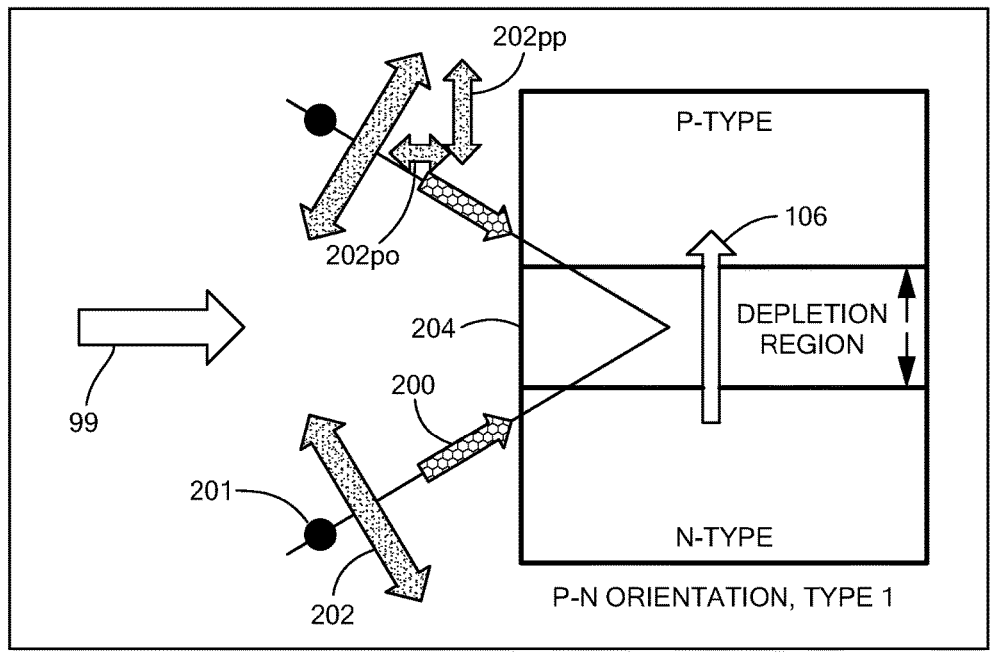
FIGS. 11A-11B show a photovoltaic device intercepting an illumination beam of incoherent radiation after passing through a condenser optical system of FIG. 2 to a body having two p-n junction orientations relative to the illumination beam; one of the orientations being shown in FIG. 11A and the other being shown in FIG. 11B.
Figure 11B:
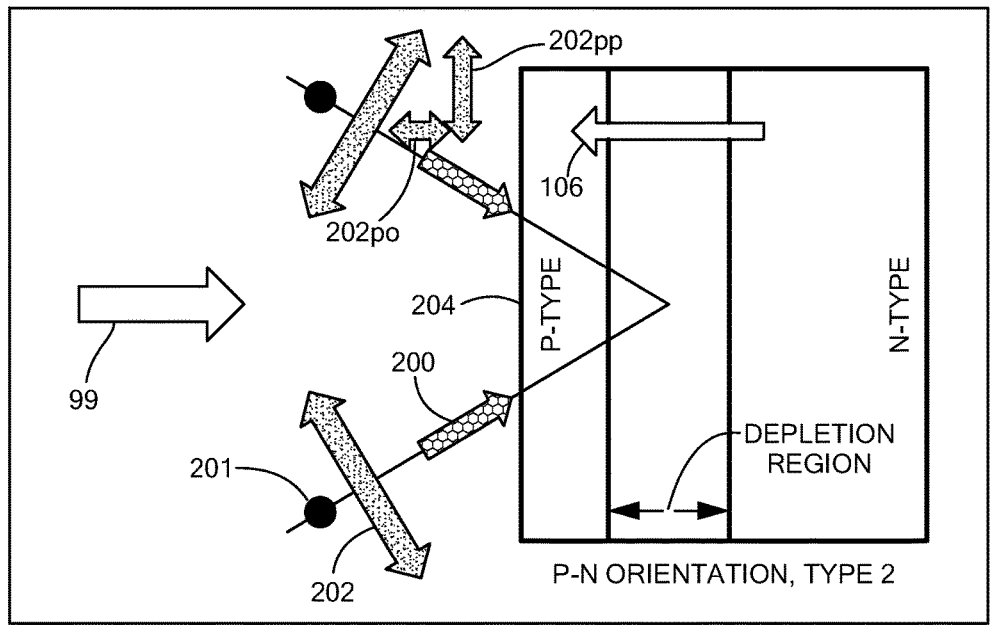

Referring now to FIGS. 11A and 11B, two relative illumination and p-n junction orientations are shown and utilized to describe potential embodiments of the PV multi-photon absorption electrical power generation device according to the disclosure. The orientation of the p-n junction also defines the orientation of the electric field (106) in the depletion region. Orientation alternatives to those described here, as example and definitions, are obvious to those skilled in the art of PV device development.

The mean direction of the illumination photons radiating the p-n device is depicted by (99). Individual rays (200) illuminate the p-n junction, with orientations of type 1 or 2 as shown in FIGS. 11A and 11B. The electric field for the individual rays may have a completely random polarization state or fixed polarization states. Fixed polarization states can be natural or man-made. Under certain observational conditions, the optimum operation of the nonlinear multi-photon device will require fixed polarization states. If the polarization states are not naturally fixed, they can be generated by utilizing polarization state diagnosis, separation, and reformatting devices, which convert existing polarization states to desired polarization states. The polarization state of the light radiating the p-n junction surface (204) can be decomposed into two orthogonal polarization states, known as s-polarization (201) and p-polarization (202). S-polarization (201) is defined to be perpendicular to the plane of incidence, and p-polarization (202) is defined to be in the plane of incidence. The plane of incidence is defined to be the plane containing the radiated surface normal vector and the incident ray vector. For the examples shown in FIGS. 11A and 11B the plane of incidence corresponds to the plane defined by the page. Therefore, the s-polarization electric field, depicted in FIGS. 11A and 11B, modulates in and out of the page. For p-polarization it is further useful to decompose the electric field into components (202pp) parallel to the radiated surface (204) and orthogonal (202po) to the radiated surface (204).

The simplest embodiment for the nonlinear PV device does not account for the random polarization state of potential natural sources. However, to optimize efficiency polarization diagnosis, separation, and reformatting devices can be utilized, as disclosed. The depicted embodiments to be described show the general polarization states decomposed into s-polarized (100s), p-polarization (100pp) parallel to the radiated surface (204), and p-polarization (100po) orthogonal to the radiated surface (204).

Figure 12A:
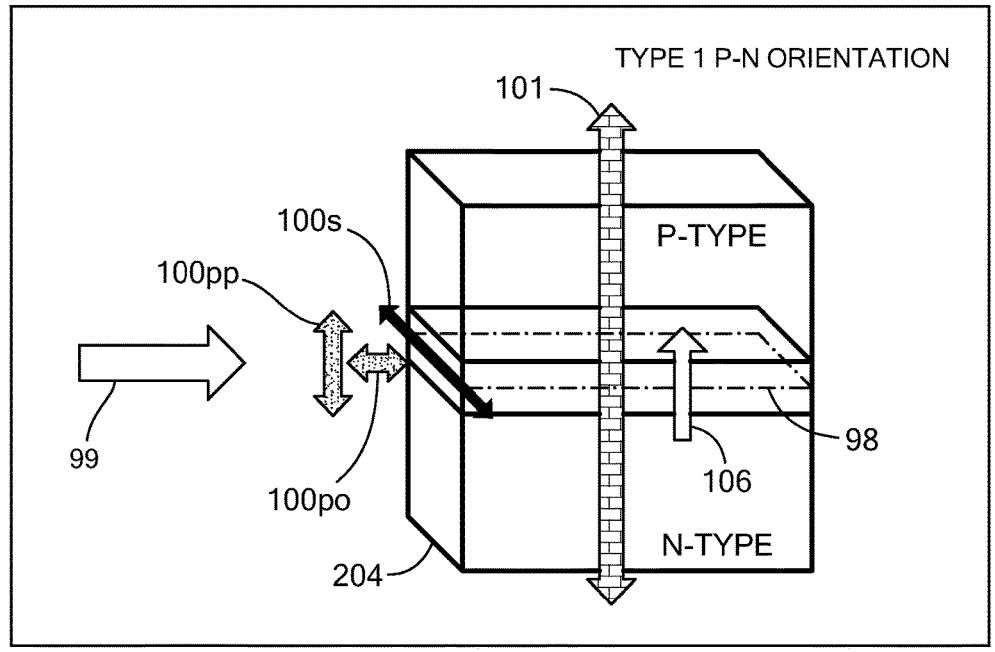
FIGS. 12A-12F show a photovoltaic device intercepting an illumination beam of incoherent radiation after passing through a condenser optical system of FIG. 2 using nonlinear multi-photon absorption with an applied magnetic field as in FIG. 4; for various orientations of the magnetic field and the body in accordance with another embodiment of the disclosure.

Referring now to FIGS. 12A-12F, FIG. 12A shows an arrangement wherein a magnetic field (101) is applied to a p-n junction with a predetermined orientation herein designated as a type 1 orientation. The magnetic field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). It should be noted that in all cases applied fields can be in the same direction or opposite direction as indicated in FIG. 12A.

Figure 12B:
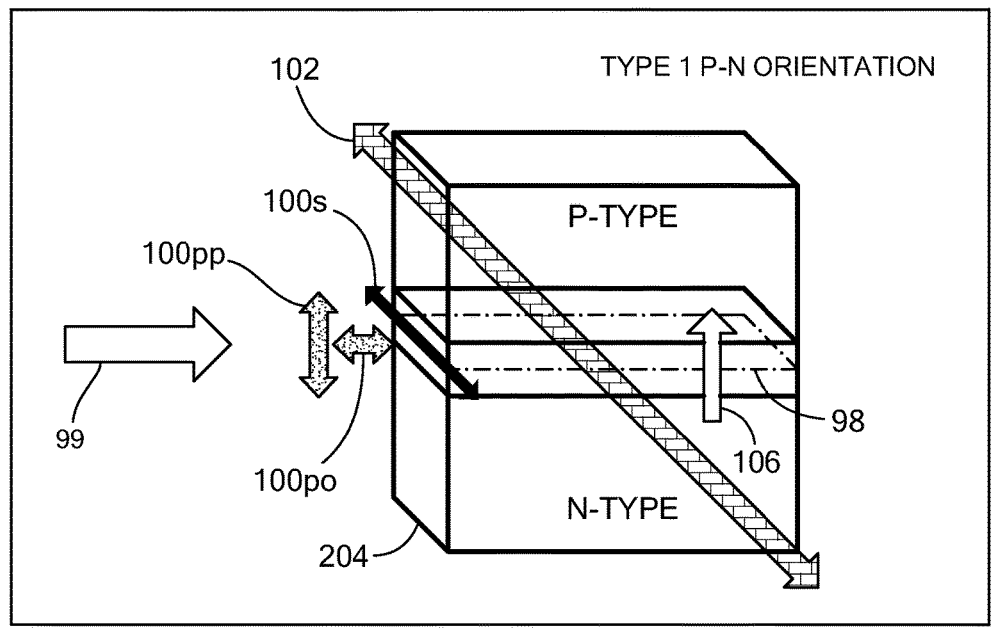

Referring now to FIG. 12B shows an arrangement wherein a magnetic field (102) is applied to a p-n junction with type 1 orientation. The magnetic field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in FIG. 12B.

Figure 12C:
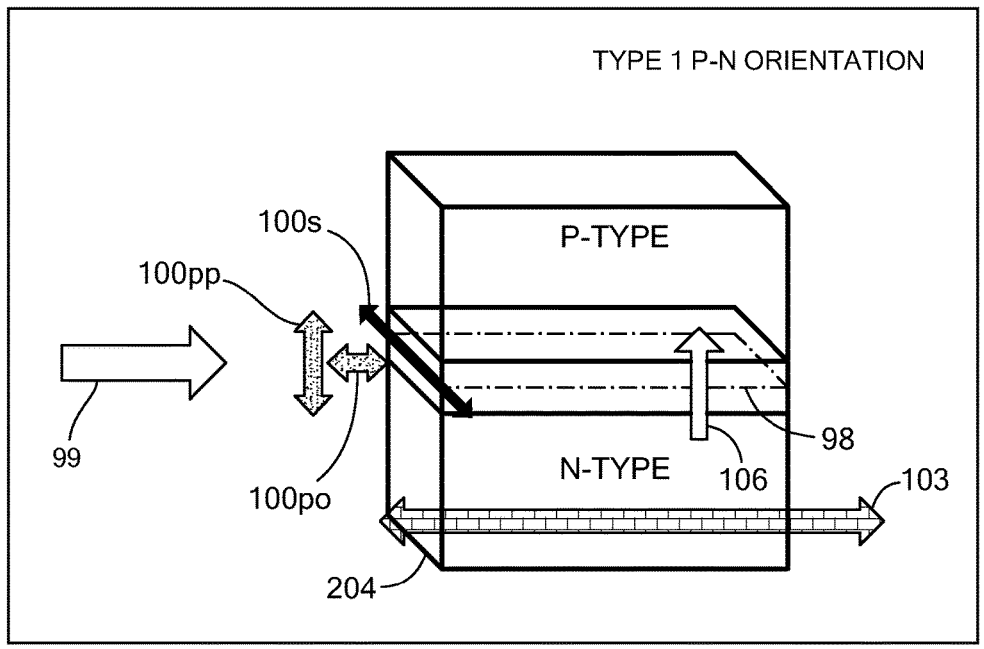

Referring now to FIG. 12C shows an arrangement wherein a magnetic field (103) is applied to a p-n junction with a type 1 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in FIG. 12C.

Figure 12D:
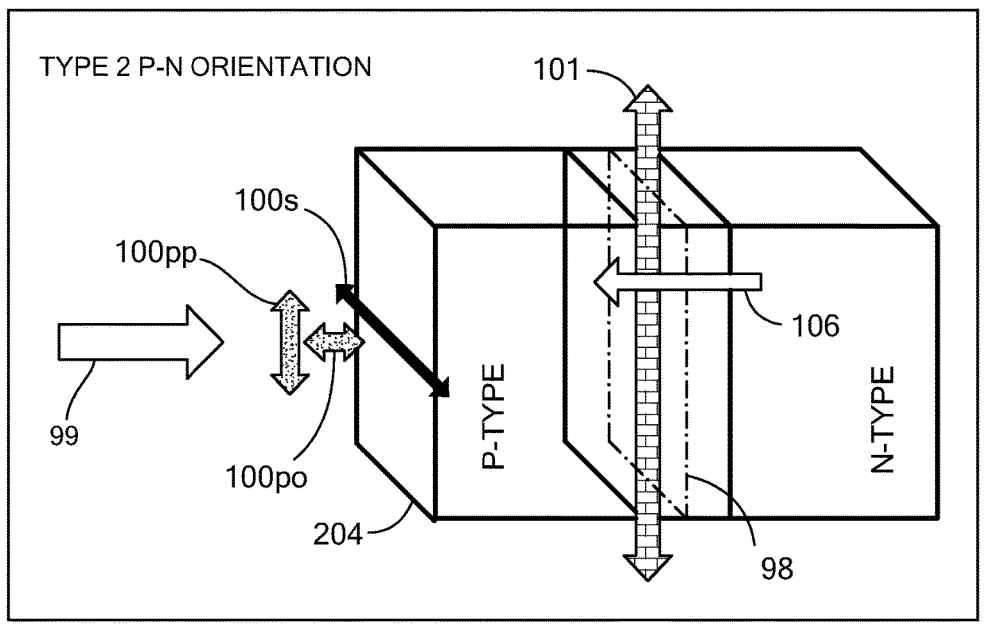

Referring now to FIG. 12D shows an arrangement wherein a magnetic field (101) is applied to a p-n junction with different orientation than that of FIGS. 12A-12C, here designated a type 2 orientation. The magnetic field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in FIG. 12D.

Figure 12E:
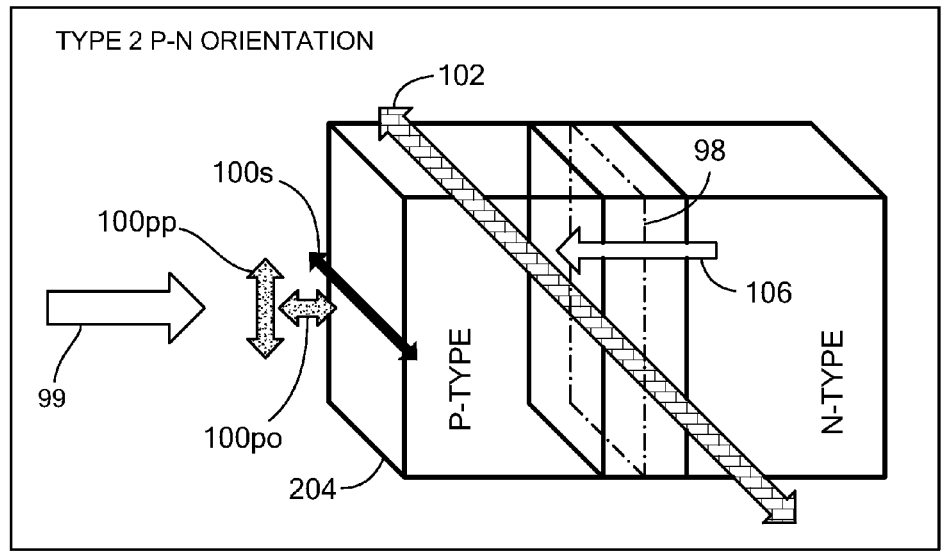

Referring now to FIG. 12E shows an arrangement wherein a magnetic field (102) is applied to a p-n junction with type 2 orientation. The magnetic field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in FIG. 12E.

Figure 12F:
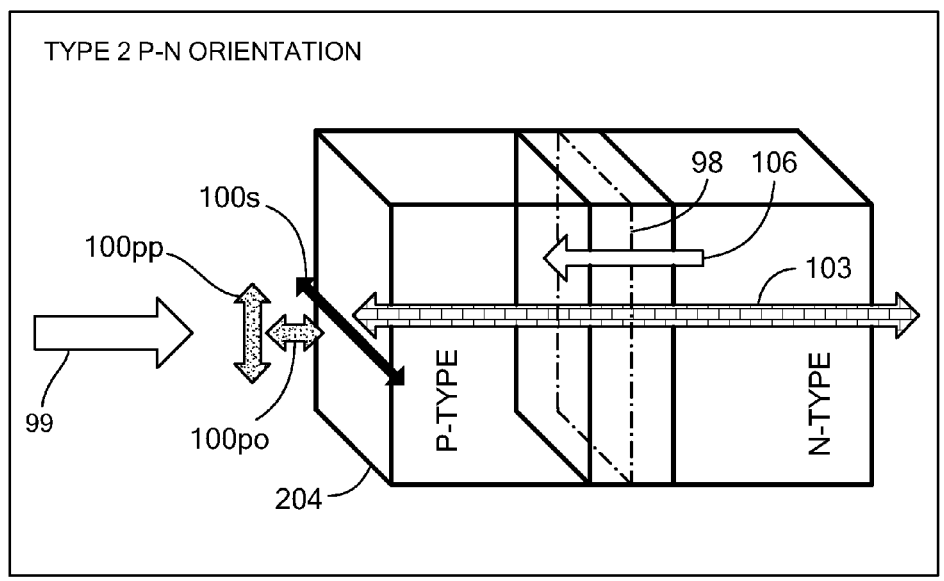

Referring now to FIG. 12F shows an arrangement wherein a magnetic field (103) is applied to a p-n junction with type 2 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106). It should be noted that in all cases applied fields can be in the same direction or opposite direction as indicated in FIG. 12F.

Referring now to FIGS. 13A-13F, FIG. 13A shows an arrangement wherein an electric field (107) is applied to a p-n junction with type 1 orientation. The electric field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). It should be noted that in all cases applied fields can be in the same direction or opposite direction as indicated in the figure.

Figure 13A:
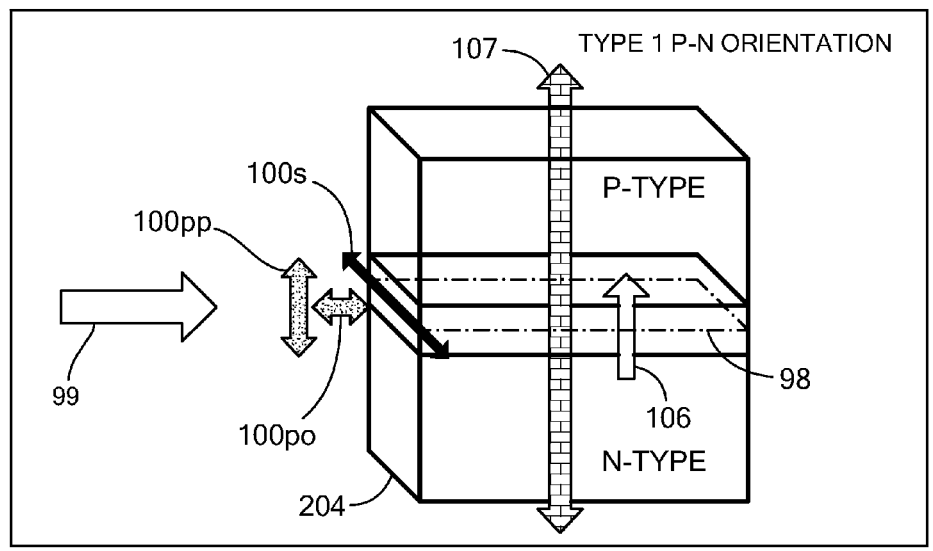
FIGS. 13A-13F show a photovoltaic device intercepting an illumination beam of incoherent radiation after passing through a condenser optical system of FIG. 2 using nonlinear multi-photon absorption with an applied electric field; for various orientations of the electric field and the body in accordance with another embodiment of the disclosure.
Figure 13B:
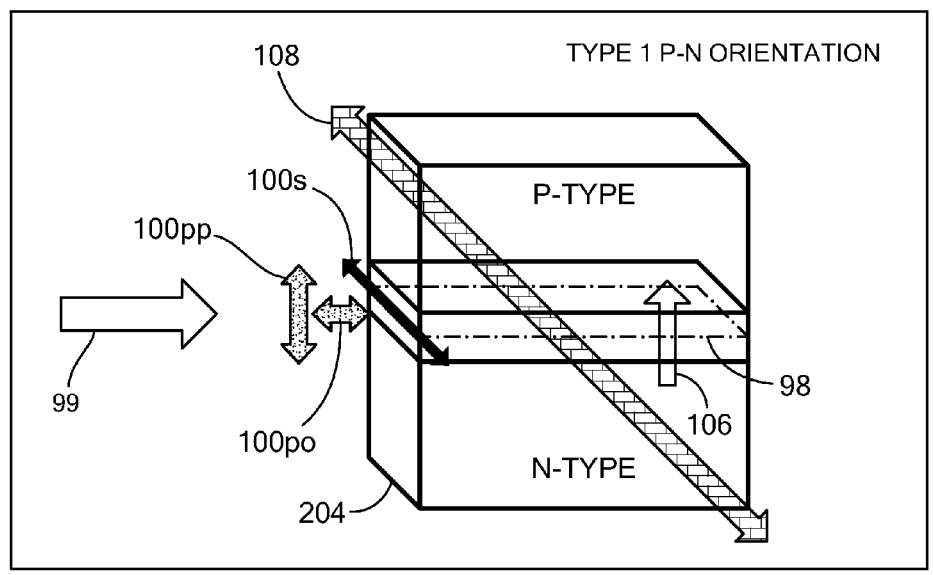

Referring now to FIG. 13B shows an arrangement wherein an electric field (108) is applied to a p-n junction with the type 1 orientation. The electric field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Figure 13C:
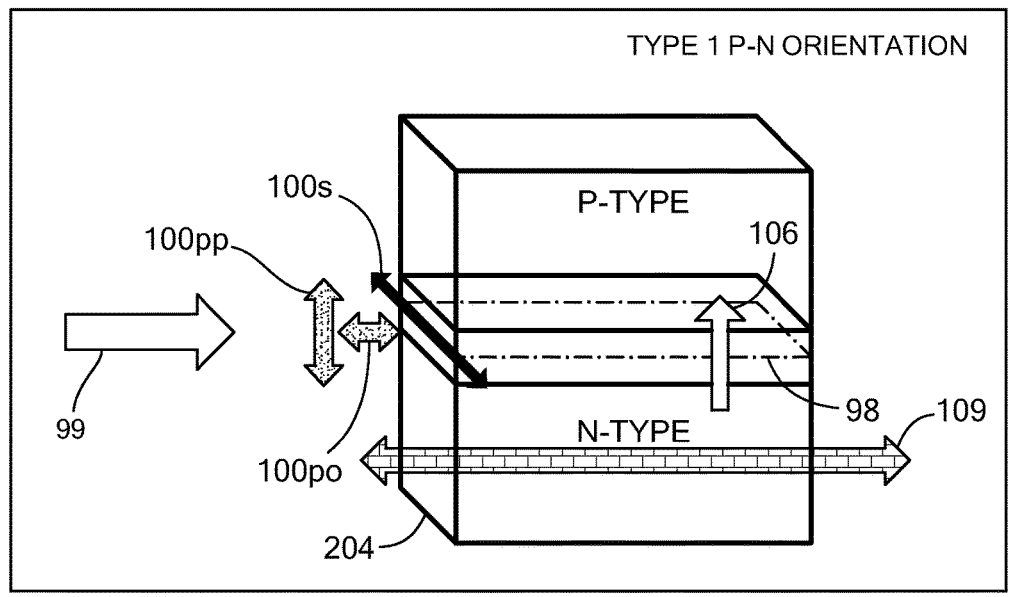

Referring now to FIG. 13C shows an arrangement wherein an electric field (109) is applied to a p-n junction with a type 1 orientation. The electric field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Figure 13D:
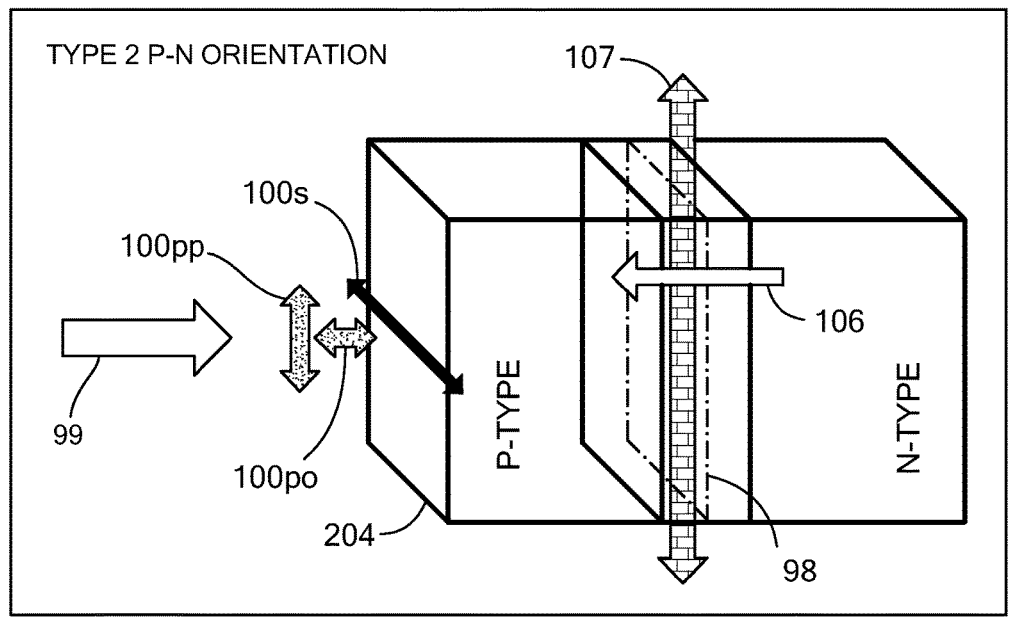

Referring now to FIG. 13D shows an arrangement wherein an electric field (107) is applied to a p-n junction with type 2 orientation. The electric field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 13E:
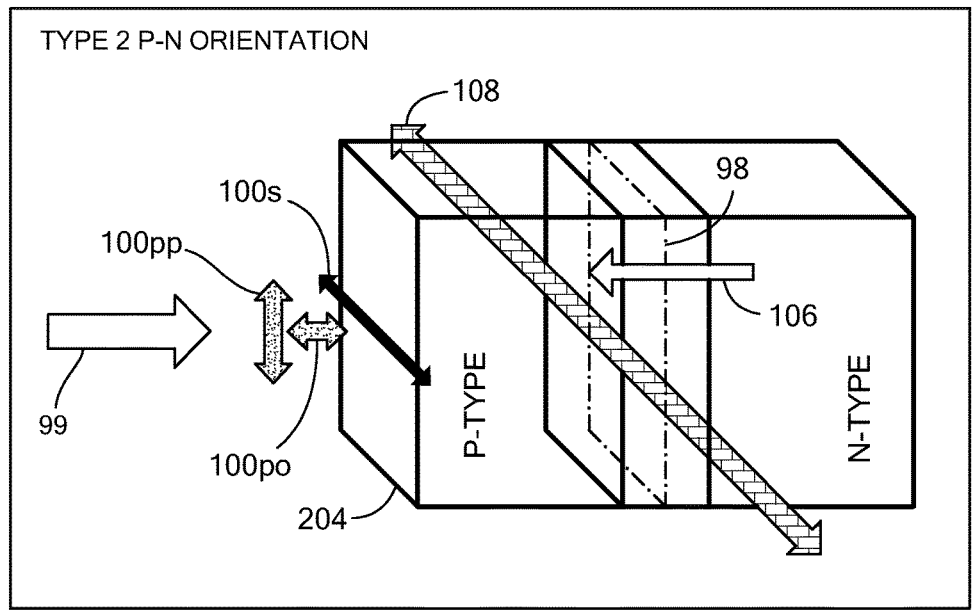

Referring now to FIG. 13E shows an arrangement wherein an electric field (108) is applied to a p-n junction with type 2 orientation. The electric field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 13F:
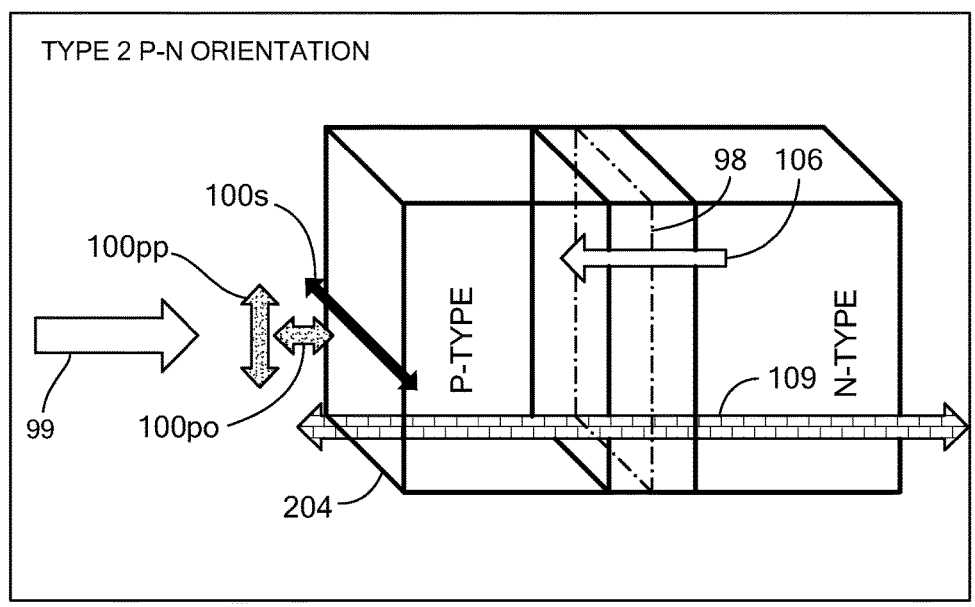

Referring now to FIG. 13F shows an arrangement wherein an electric field (109) is applied to a p-n junction with type 2 orientation. The electric field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106). It should be noted that in all cases applied fields can be in the same direction or opposite direction as indicated in the figure.

Referring now to FIGS. 14A-14F, FIG. 14A shows an arrangement wherein a parallel magnetic field (101) and electric field (104) are applied simultaneously to a p-n junction with type 1 orientation. The magnetic and electric fields are: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). It should be noted that in all cases applied fields can be in the same direction or opposite direction as indicated in the figure.

Figure 14A:
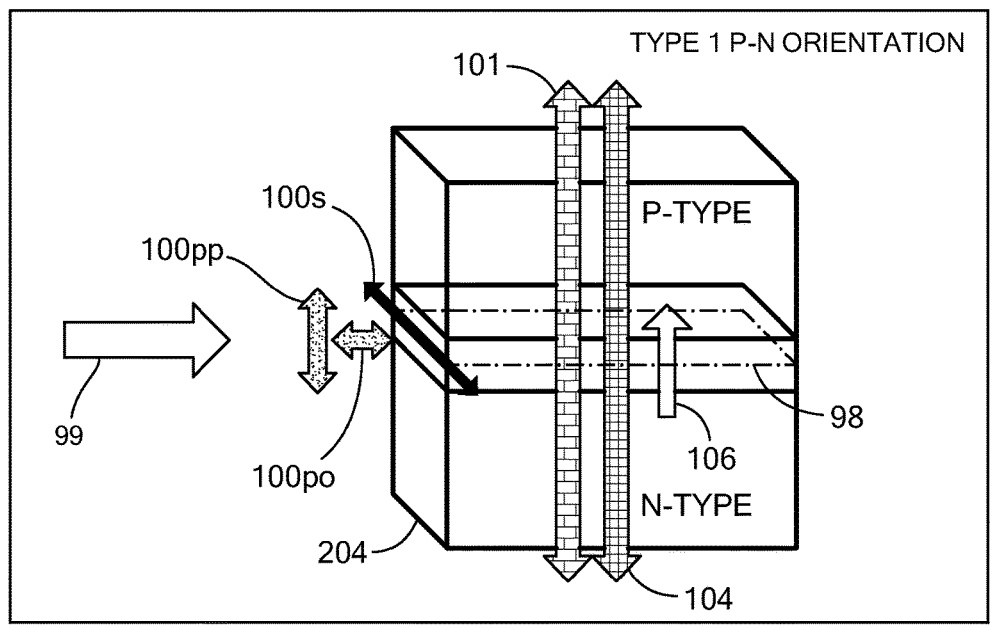
FIGS. 14A-14F show a photovoltaic device intercepting an illumination beam of incoherent radiation after passing through a condenser optical system of FIG. 2 using nonlinear multi-photon absorption with applied parallel electric and magnetic fields for various orientations of the electric and magnetic fields and the body in accordance with another embodiment of the disclosure.
Figure 14B:
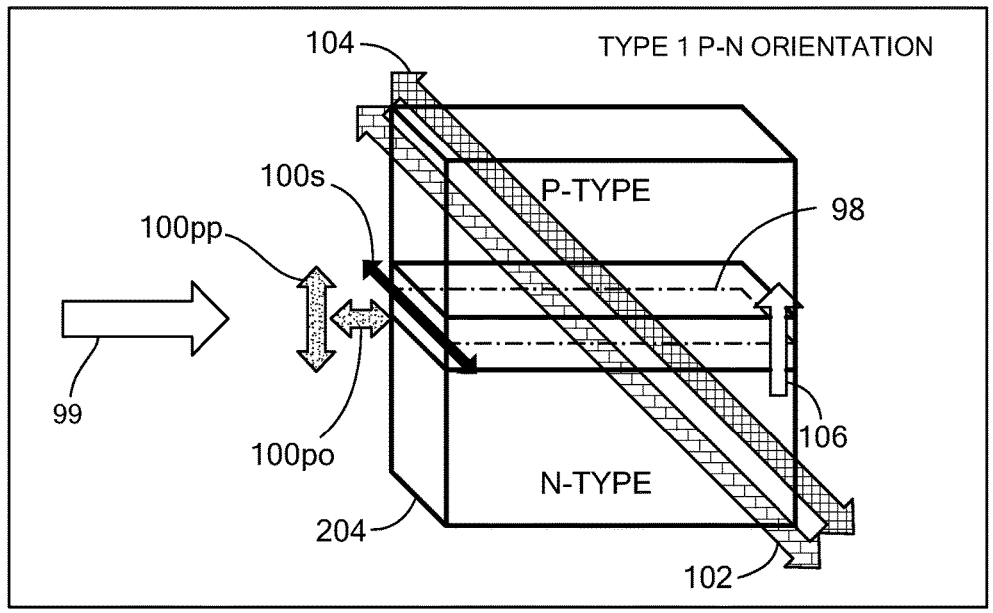

Referring now to FIG. 14B shows an arrangement wherein parallel magnetic field (102) and electric field (104) are applied simultaneously to a p-n junction with type 1 orientation. The magnetic field and electric field are: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Figure 14C:
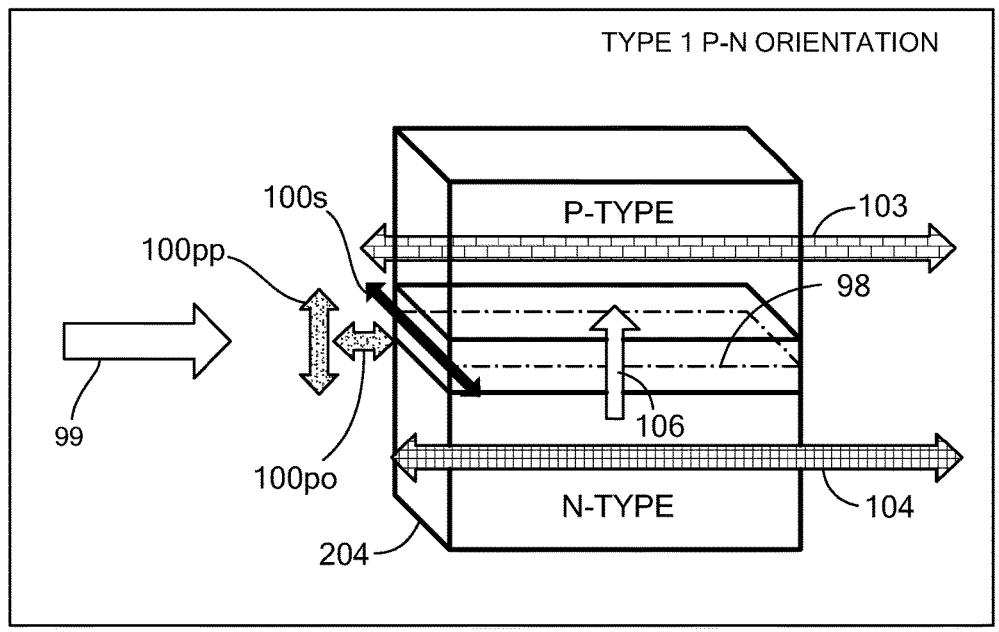

Referring now to FIG. 14C shows an arrangement wherein parallel magnetic field (103) and electric field (104) are applied simultaneously to a p-n junction with a type 1 orientation. The magnetic field and electric field are: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Figure 14D:
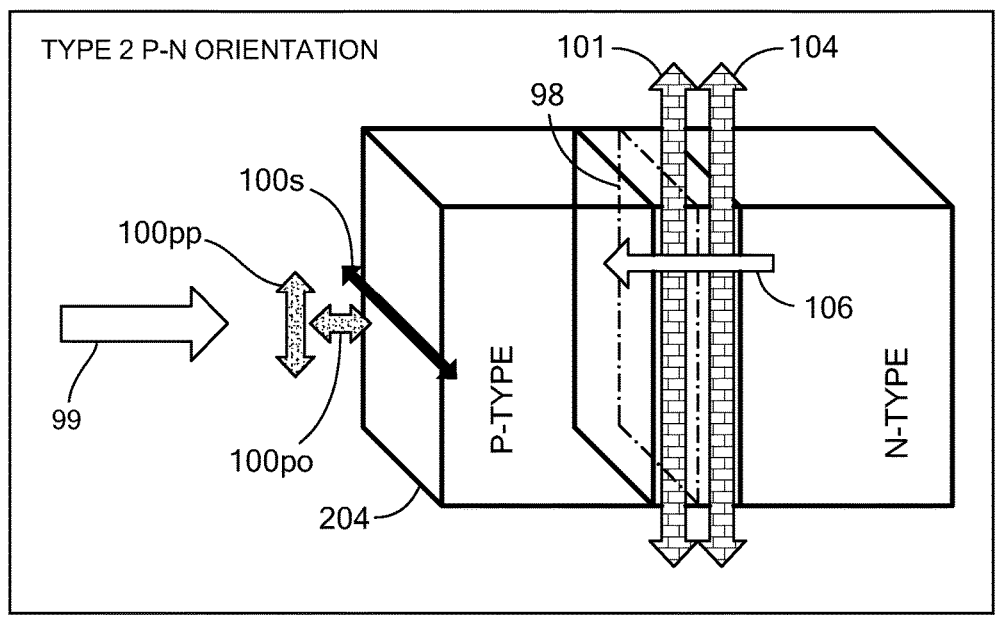

Referring now to FIG. 14D shows an arrangement wherein parallel magnetic field (101) and electric field (104) are applied simultaneously to a p-n junction with type 2 orientation. The magnetic field and electric field are: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 14E:
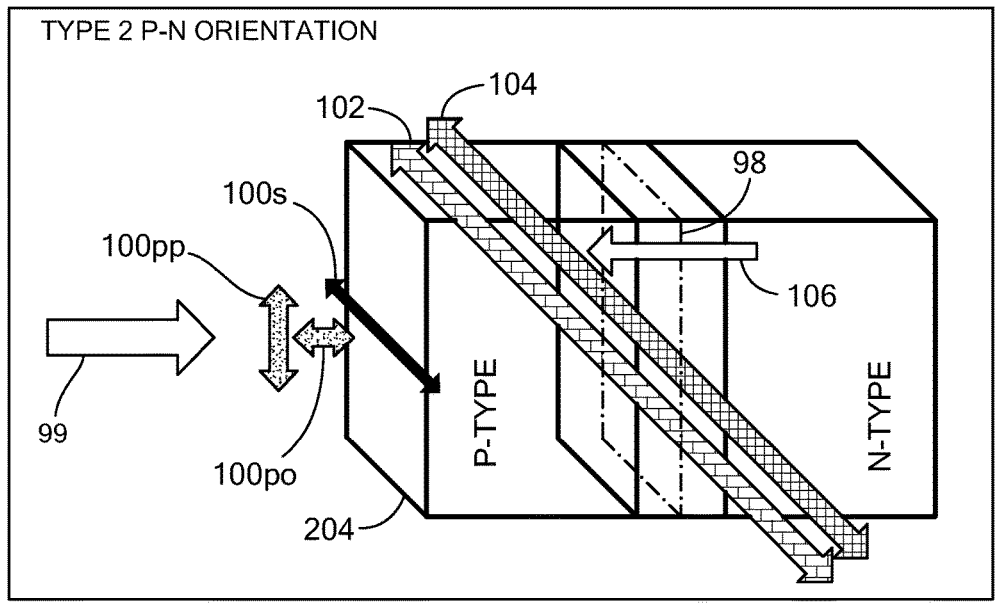

Referring now to FIG. 14E shows an arrangement wherein parallel magnetic field (102) and electric field (104) to a p-n junction are applied simultaneously to a body with type 2 orientation. The magnetic field and electric field are: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 14F:
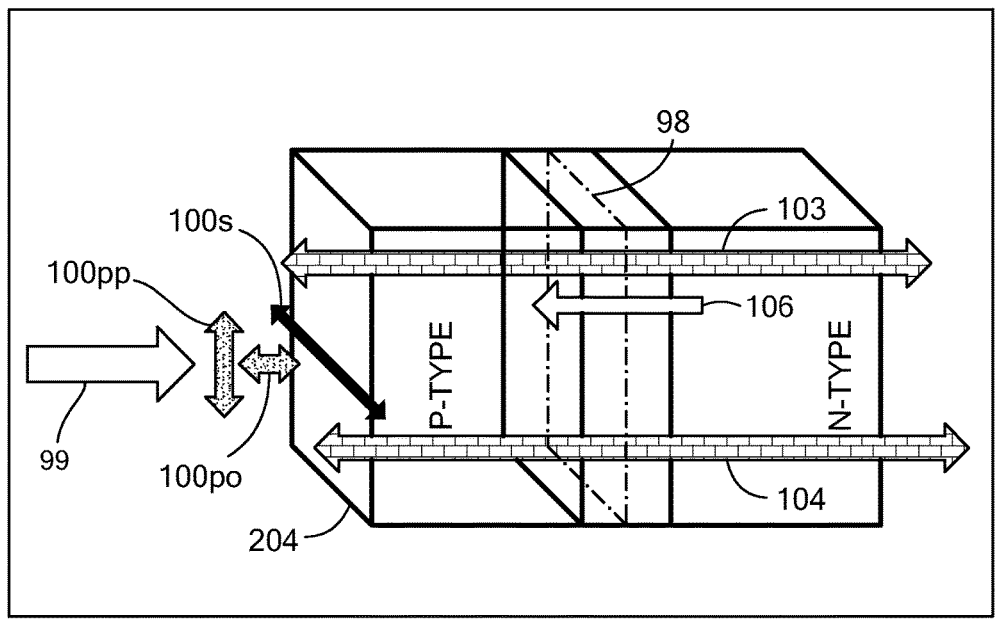

Referring now to FIG. 14F shows an arrangement wherein parallel magnetic field (103) and electric field (104) are applied simultaneously to a p-n junction with type 2 orientation. The magnetic field and electric field are: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106). It should be noted that in all cases applied fields can be in the same direction or opposite direction as indicated in the figure.

Referring now to FIGS. 15A-15F, FIG. 15A shows an arrangement wherein orthogonal magnetic (101) and electric (105) fields are applied simultaneously to a p-n junction with type 1 orientation. The magnetic field (101) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). The electric field (105) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Figure 15A:
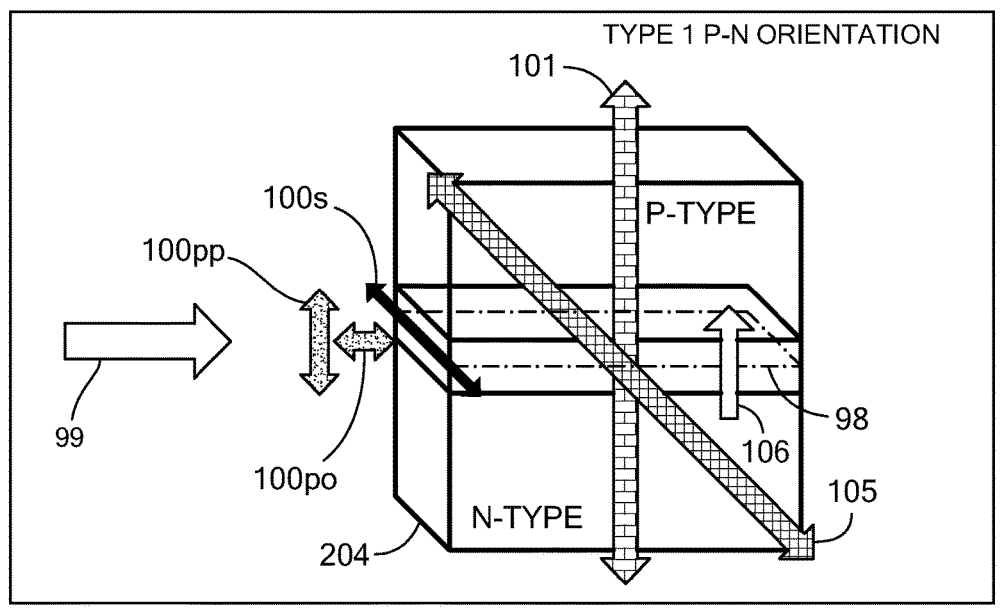
FIGS. 15A-15F show a photovoltaic device intercepting an illumination beam of incoherent radiation after passing through a condenser optical system of FIG. 2 using nonlinear multi-photon absorption with applied orthogonal electric and magnetic fields for various orientations of the electric field and magnetic and the body, with the body having one orientation with respect to the incoming beam in accordance with another embodiment of the disclosure.
Figure 15B:
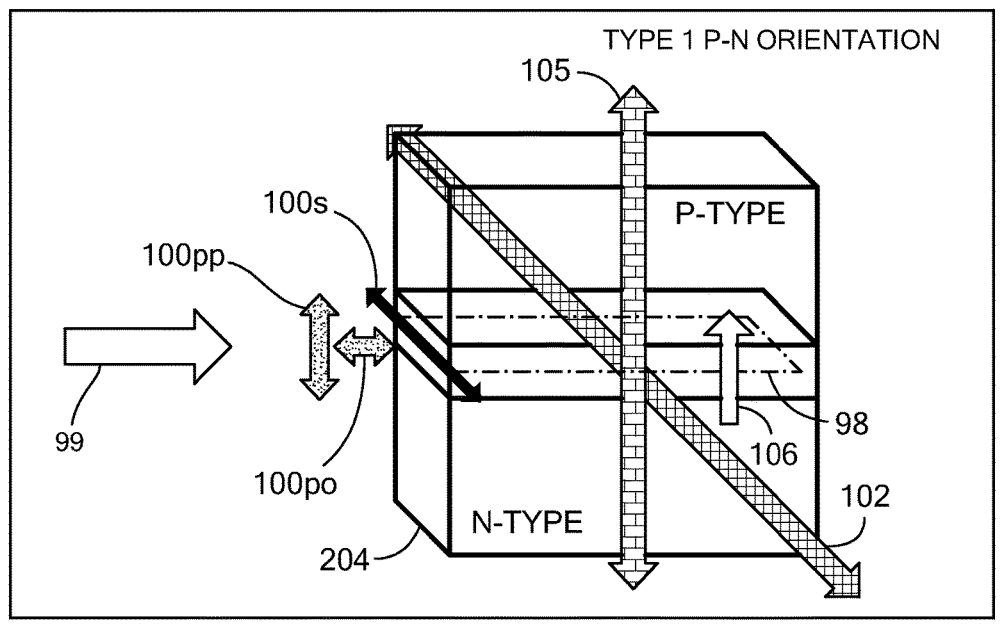

Referring now to FIG. 15B shows an arrangement wherein orthogonal magnetic (102) and electric (105) fields are applied simultaneously to a p-n junction with type 1 orientation. The magnetic field (102) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). The electric field (105) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). It should be noted that in all cases applied fields can be in the same direction or opposite direction as indicated in the figure.

Figure 15C:
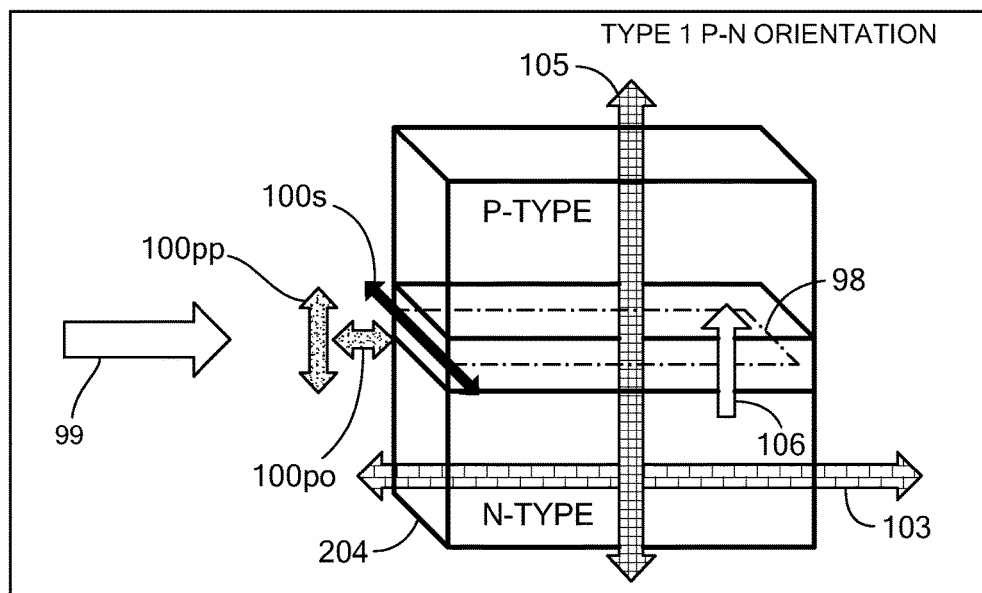

Referring now to FIG. 15C shows an arrangement wherein orthogonal magnetic (103) and electric (105) fields are applied simultaneously to a p-n junction with a type 1 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106). The electric field (105) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). It should be noted that in all cases applied fields can be in the same direction or opposite direction as indicated in the figure.

Figure 15D:
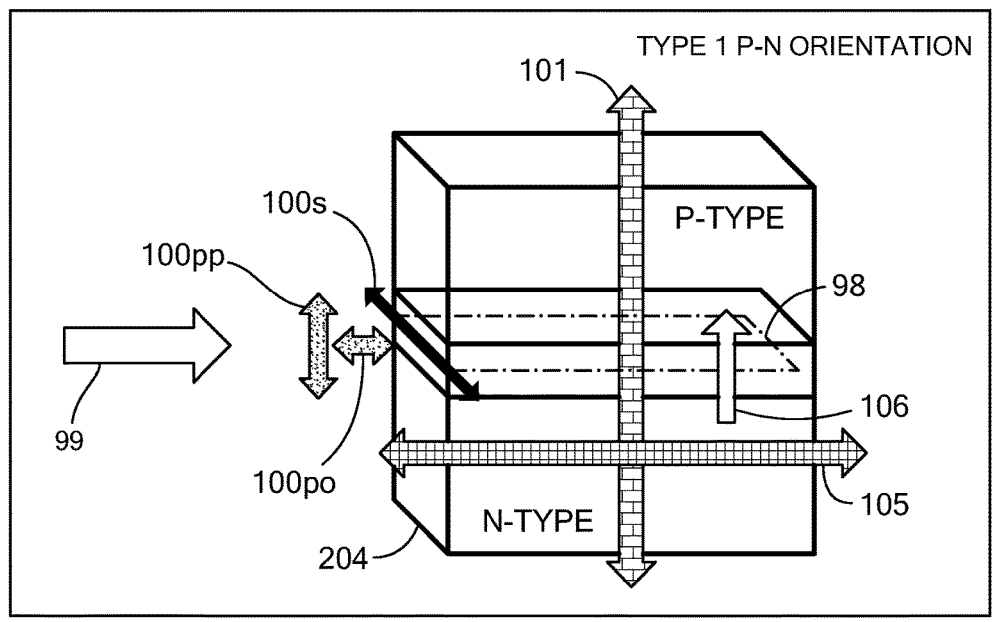

Referring now to FIG. 15D shows an arrangement wherein orthogonal magnetic (101) and electric (105) fields are applied simultaneously to a p-n junction with type 1 orientation. The magnetic field (101) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) orthogonal to the p-n junction interface (98), and 5) parallel to the depletion region electric field (106). The electric field (105) is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106).

Figure 15E:
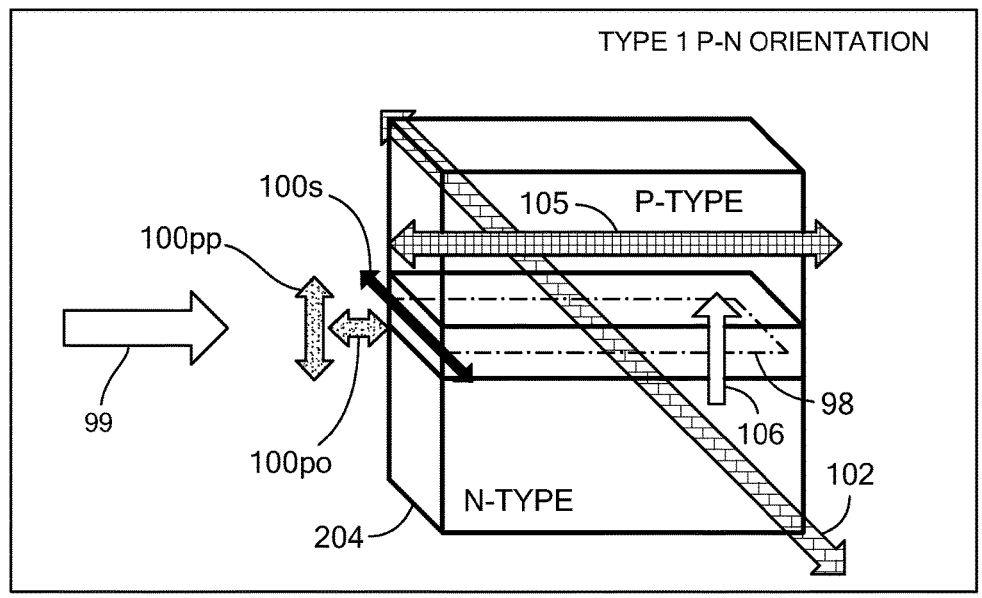

Referring now to FIG. 15E shows an arrangement wherein orthogonal magnetic (102) and electric (105) fields are applied simultaneously to a p-n junction with type 1 orientation. The magnetic field (102) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). The electric field (105) is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106).

Figure 15F:
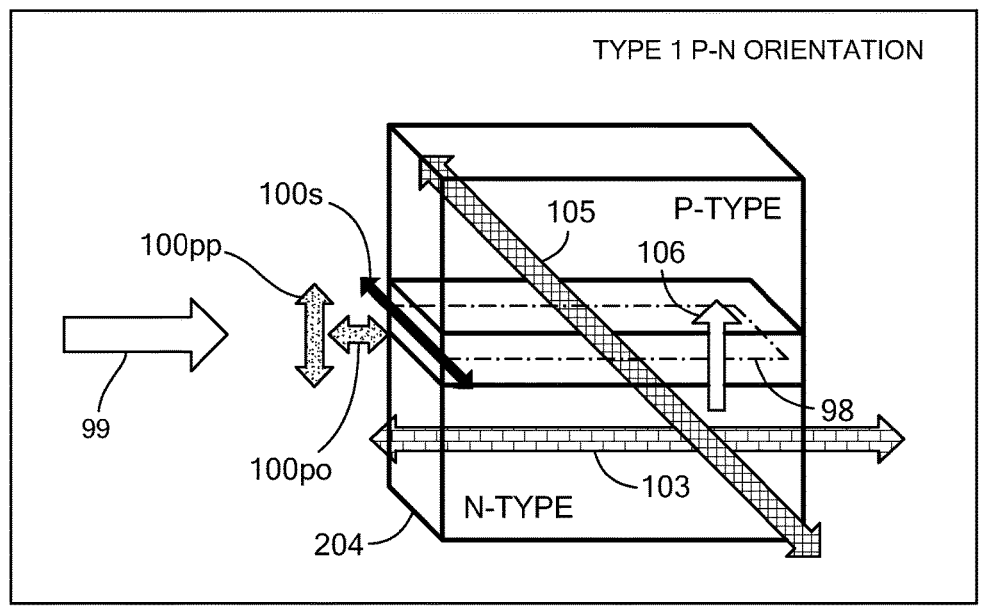

Referring now to FIG. 15F shows an arrangement wherein orthogonal magnetic (103) and electric (105) fields are applied simultaneously to a p-n junction with a type 1 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) parallel to the p-n junction interface (98), and 5) perpendicular to the depletion region electric field (106). The electric field (105) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) perpendicular to the depletion region electric field (106). It should be noted that in all cases applied fields can be in the same direction or opposite direction as indicated in the figure.

Referring now to FIGS. 16A-16F, FIG. 16A shows an arrangement wherein orthogonal magnetic (101) and electric (105) fields are applied simultaneously to a p-n junction with type 2 orientation. The magnetic field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). The electric field (105) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 16A:
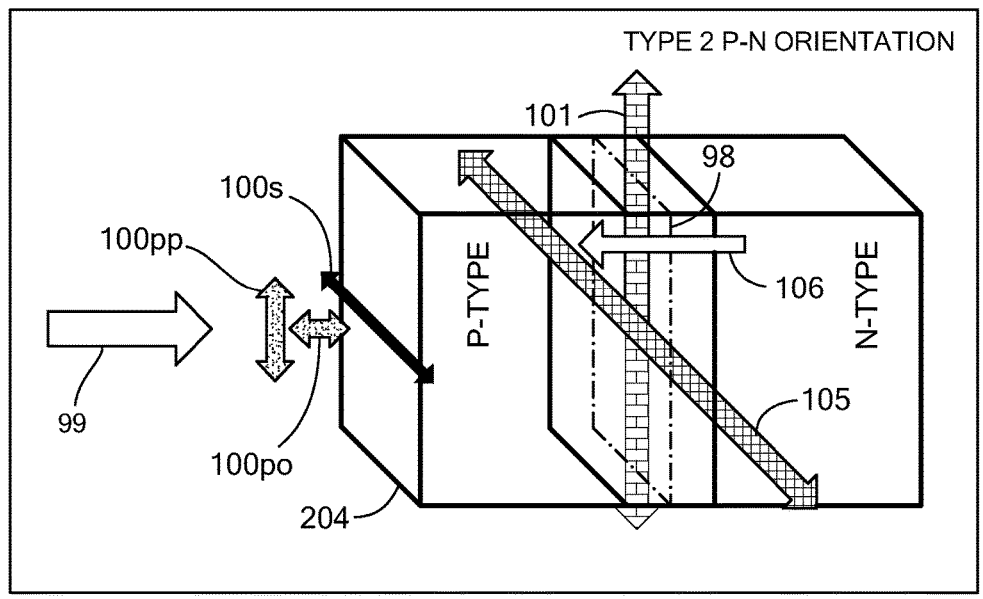
FIGS. 16A-16F show a photovoltaic device intercepting an illumination beam of incoherent radiation after passing through a condenser optical system of FIG. 2 using nonlinear multi-photon absorption with applied orthogonal electric and magnetic fields for various orientations of the electric field and magnetic and the body, with the body having a different orientation than the orientation of the body in FIGS. 15A-15F in accordance with another embodiment of the disclosure.
Figure 16B:
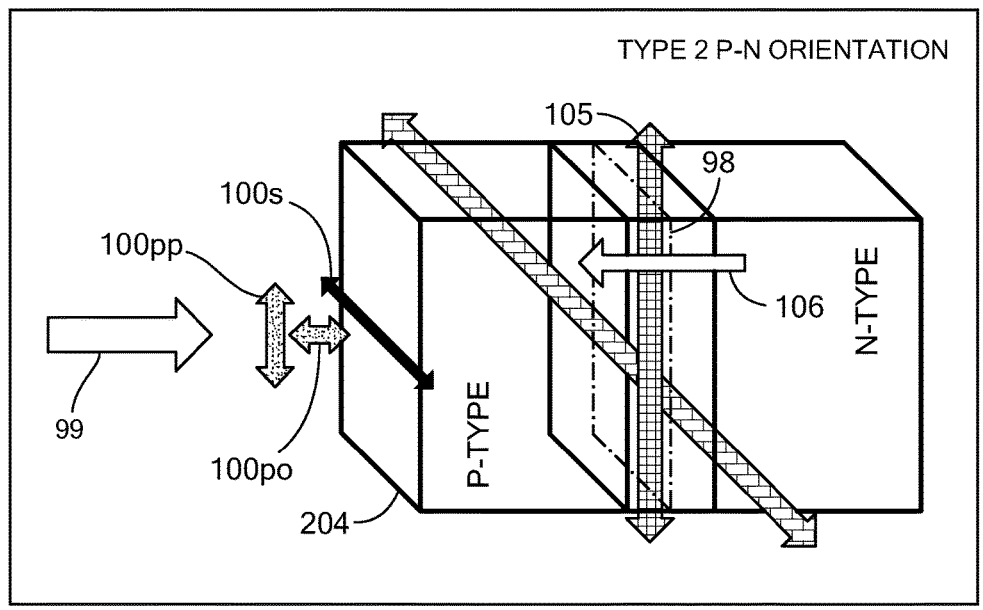

FIG. 16B shows an arrangement wherein orthogonal magnetic (102) and electric (105) fields are applied simultaneously to a p-n junction with type 2 orientation. The magnetic field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). The electric field (105) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 16C:
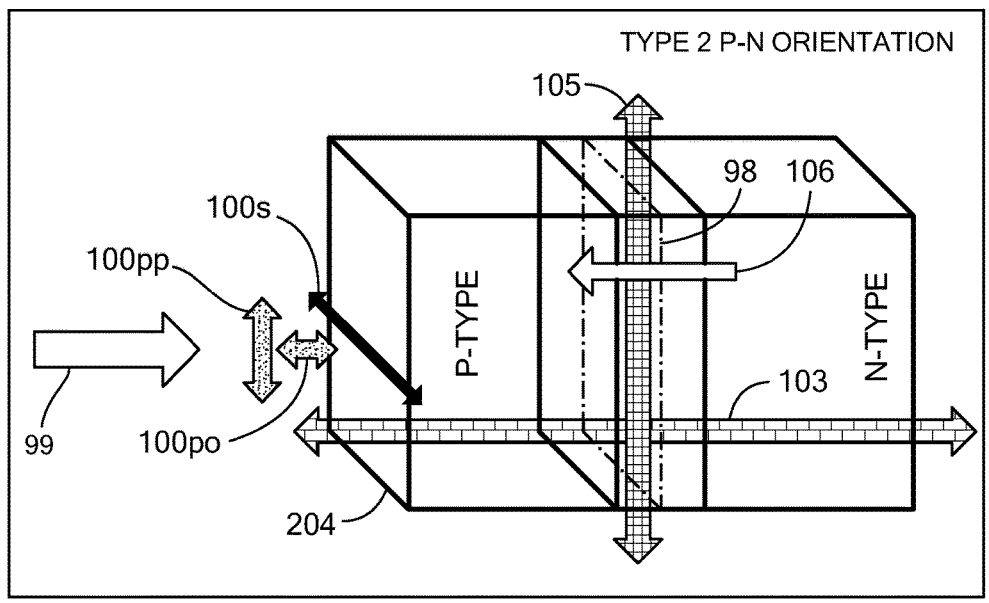

FIG. 16C shows an arrangement wherein orthogonal magnetic (103) and electric (105) fields are applied to a p-n junction with type 2 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106). The electric field (105) is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). It should be noted that in all cases applied fields can be in the same direction or opposite direction as indicated in the figure.

Figure 16D:
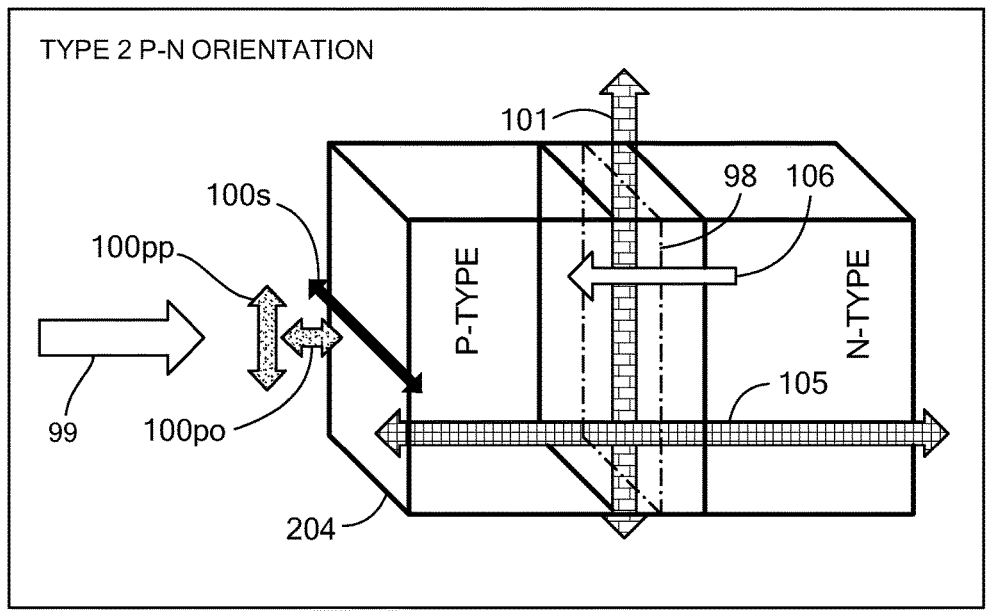

FIG. 16D shows an arrangement wherein orthogonal magnetic (101) and electric (105) fields are applied simultaneously to a p-n junction with type 2 orientation. The magnetic field is: 1) parallel to the incoming p-polarization component (100pp) parallel to the radiated surface (204); 2) perpendicular to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). The electric field (105) is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106).

Figure 16E:
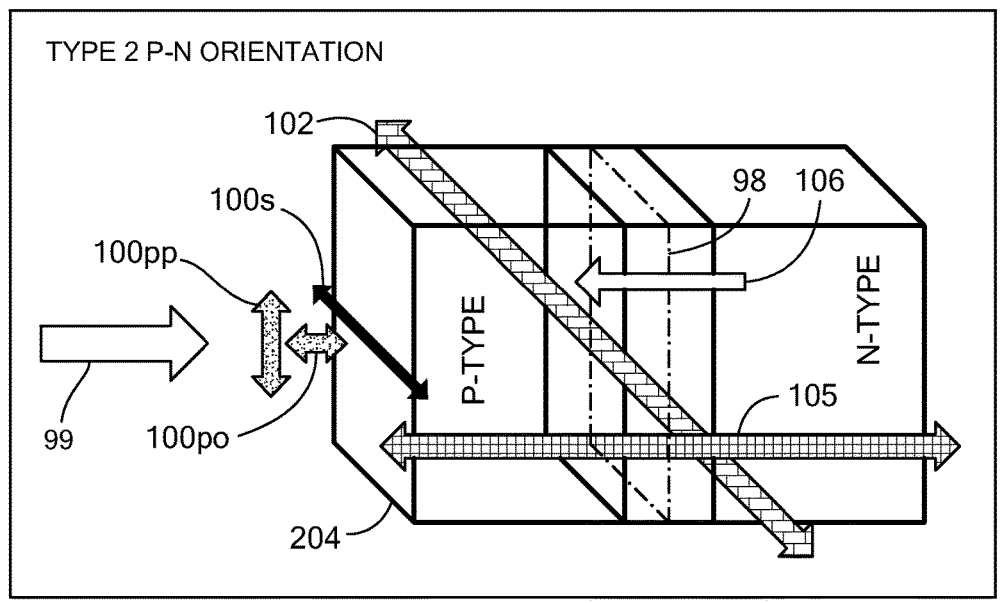

FIG. 16E shows an arrangement wherein orthogonal magnetic (102) and electric (105) fields are applied to a p-n junction with type 2 orientation. The magnetic field is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106). The electric field (105) is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106).

Figure 16F:
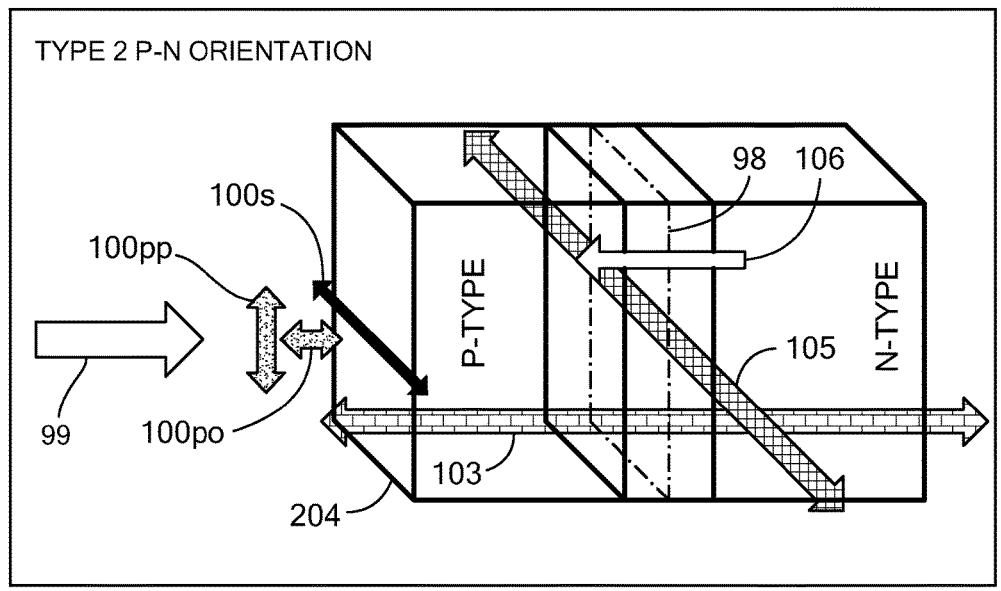

FIG. 16F shows an arrangement wherein orthogonal magnetic (103) and electric (105) fields are applied simultaneously to a p-n junction with type 2 orientation. The magnetic field is: 1) perpendicular to the incoming p-polarization component (100pp) parallel to the radiated surface (204); 2) perpendicular to the s-polarization component (100s) parallel to the radiated surface (204); 3) parallel to the p-polarization component (100po) perpendicular to the radiated surface (204); 4) perpendicular to the p-n junction interface (98), and 5) parallel to the depletion region electric field (106). The electric field (105) is: 1) perpendicular to the incoming p-polarization component (100pp) parallel to the radiated surface (204); 2) parallel to the s-polarization component (100s) parallel to the radiated surface (204); 3) perpendicular to the p-polarization component (100po) perpendicular to the radiated surface (204); 4) parallel to the p-n junction interface (98), and 5) orthogonal to the depletion region electric field (106).

A number of embodiments of the disclosure have been described. Nevertheless, it will be understood that various modifications may be made without departing from the spirit and scope of the disclosure. Various orderings and implementations of elements can deviate from the embodiment figures. For example, interchanging the order of the optical band pass filter and the polarization beam splitter in FIG. 6 or utilizing different methods to generate spectral filters (15a). Further, III-V ternary $Ga_{1-x}In_xAs$, $Ga_{1-x}In_xSb$ and $InAs_yP_{1-y}$ compound semiconductors with variable bandgaps are material which may be used for body 12. Bandgap tuning and high-linear optical transmissions may be used. Further, the use of the magnetic field and/or electric field may be used with SPA photovoltaic devices.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method comprising:
converting broadband incoherent optical radiation having an optical energy into electrical, power, the electrical power generated with a photovoltaic body using nonlinear multi-photon absorption, the converting comprising:
receiving the broadband incoherent optical radiation at an optical condenser system; and
concentrating the received incoherent optical radiation using the optical condenser system to a region on the photovoltaic body with sufficient intensity to generate the nonlinear multi-photon absorption within the photovoltaic body, wherein the method further comprises:
applying at least one of a magnetic field or an electric field to the photovoltaic body.

2. The method of claim 1, wherein the nonlinear multi-photon absorption occurs in the photovoltaic body having predetermined bandgap energy and wherein the broadband incoherent optical radiation comprises photons having energy levels less than the predetermined bandgap energy.

3. The method of claim 1, wherein the photovoltaic body is a semiconductor body.

4. The method of claim 1, wherein the nonlinear multi-photon absorption generates carriers comprising electrons and holes, the method further including providing electrical circuitry external to the photovoltaic body to provide an electrical path for the carriers.

5. The method of claim 4, further comprising providing the photovoltaic body with a pair of electrodes in ohmic contact with the photovoltaic body and wherein the electrical path is provided between the pair of electrodes.

6. The method of claim 1, wherein the optical energy has an optical flux equal to or greater than $10^5$ W/cm$^2$.

7. The method of claim 1, wherein the photovoltaic body is a ternary and binary semiconductor body.

8. The method of claim 1, wherein the applying comprises:
applying theft magnetic field to the photovoltaic body.

9. The method of claim 1, wherein the applying comprises:
applying the electric field to the photovoltaic body.

10. The method of claim 1, wherein the converting further comprises:
splitting the broadband incoherent light into at least two different light polarizations; and
combining the at least two different light polarizations to generate combined light, wherein the concentrating comprises:
directing the combined light toward the photovoltaic body.

11. The method of claim 1, further comprising coupling the electrical power to a load external to the photovoltaic body.

12. The method of claim 1, wherein the concentrating results in concentrated light with the sufficient intensity, the method further comprising:
- passing the concentrated light through the photovoltaic body; and
- receiving at least some of the concentrated light from the photovoltaic body with another photovoltaic body to generate additional electrical power.

13. A method comprising:
converting broadband incoherent optical radiation having an optical energy into electrical power, the electrical power generated with a photovoltaic body using non-linear multi-photon absorption, the converting comprising:
- receiving the broadband incoherent optical radiation at an optical condenser system; and
- concentrating the received incoherent optical radiation using the optical condenser system to a region on the photovoltaic body with sufficient intensity to generate the nonlinear multi-photon absorption within the photovoltaic body;
- splitting the broadband incoherent light into at least two different light polarizations; and
- combining the at least two different light polarizations to generate combined light, wherein the concentrating comprises:
- directing the combined light toward the photovoltaic body.

* * * * *